US009324419B2

(12) United States Patent
Pang et al.

(10) Patent No.: US 9,324,419 B2
(45) Date of Patent: *Apr. 26, 2016

(54) MULTIPLE PASS PROGRAMMING FOR MEMORY WITH DIFFERENT PROGRAM PULSE WIDTHS

(71) Applicant: SanDisk Technologies Inc., Plano, TX (US)

(72) Inventors: Liang Pang, Fremont, CA (US); Yingda Dong, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 20 days.

This patent is subject to a terminal disclaimer.

(21) Appl. No.: 14/331,784

(22) Filed: Jul. 15, 2014

(65) Prior Publication Data
US 2016/0019947 A1 Jan. 21, 2016

(51) Int. Cl.
G11C 11/34 (2006.01)
G11C 11/56 (2006.01)
G11C 16/10 (2006.01)
G11C 16/34 (2006.01)
H01L 27/115 (2006.01)

(52) U.S. Cl.
CPC ........ G11C 11/5628 (2013.01); G11C 11/5671 (2013.01); G11C 16/10 (2013.01); G11C 16/3459 (2013.01); G11C 2211/5621 (2013.01); H01L 27/1157 (2013.01)

(58) Field of Classification Search
CPC .......... G11C 11/5628; G11C 16/3459; G11C 16/3454; G11C 2211/5621; G11C 2211/5641; G11C 13/0064; G11C 16/3436; G11C 16/344; G11C 16/3481; G11C 16/34

USPC ............. 365/185.22, 185.05, 185.11, 185.17, 365/185.18, 185.19, 185.23, 189.011
See application file for complete search history.

(56) References Cited

U.S. PATENT DOCUMENTS

| | | | |
|---|---|---|---|
| 6,700,820 | B2 | 3/2004 | Elmhurst et al. |
| 6,888,758 | B1 | 5/2005 | Hemink et al. |
| 6,937,510 | B2 | 8/2005 | Hosono et al. |
| 7,385,851 | B1 | 6/2008 | Park et al. |
| 7,447,081 | B2 | 11/2008 | Chan |
| 7,474,566 | B2 | 1/2009 | Jung et al. |
| 8,000,150 | B2 | 8/2011 | Seol et al. |
| 8,238,157 | B1 | 8/2012 | Sommer et al. |

(Continued)

OTHER PUBLICATIONS

U.S. Appl. No. 14/053,856, filed Oct. 15, 2013.

(Continued)

*Primary Examiner* — Fernando Hidalgo
(74) *Attorney, Agent, or Firm* — Vierra Magen Marcus LLP

(57) ABSTRACT

Techniques are provided for programming memory cells while reducing the effects of detrapping which cause a downshift in the threshold voltage distribution. Detrapping is particularly problematic for charge-trapping memory cells such as in a 3D stacked non-volatile memory device. After completion of a full programming pass, a verify test is performed to identify cells for which reprogramming is warranted. The reprogramming can include multiple program-verify iterations which use longer program pulses than in the full programming pass. Moreover, the number of program-verify iterations is limited to reduce the reprogramming time. In one approach, cells of all target data states are programmed together. In another approach, cells of different target data states are programmed separately.

21 Claims, 28 Drawing Sheets

(56) References Cited

U.S. PATENT DOCUMENTS

| | | |
|---|---|---|
| 8,391,070 B2 | 3/2013 | Bathul et al. |
| 8,422,292 B2 | 4/2013 | Choi et al. |
| 8,446,776 B2 | 5/2013 | Hwang et al. |
| 8,451,663 B2 | 5/2013 | Lee |
| 8,472,257 B2 | 6/2013 | Dong et al. |
| 8,477,534 B2 | 7/2013 | Iwai et al. |
| 8,681,568 B2 | 3/2014 | Tan |
| 2008/0244162 A1 | 10/2008 | Mokhlesi et al. |
| 2008/0316833 A1 | 12/2008 | Fong et al. |
| 2009/0219761 A1 | 9/2009 | Moschiano et al. |
| 2009/0238006 A1 | 9/2009 | Nobunaga |
| 2010/0046301 A1* | 2/2010 | Fong .................. G11C 11/5628 365/185.19 |
| 2010/0103733 A1 | 4/2010 | Hemink |
| 2010/0195387 A1* | 8/2010 | Park ...................... G11C 16/10 365/185.03 |
| 2012/0327716 A1* | 12/2012 | Mokhlesi ........... G11C 11/5628 365/185.19 |
| 2013/0094294 A1 | 4/2013 | Kwak et al. |
| 2013/0107653 A1 | 5/2013 | Kwak |
| 2013/0138882 A1 | 5/2013 | Shaeffer et al. |
| 2013/0163331 A1 | 6/2013 | Yoo et al. |
| 2013/0250687 A1 | 9/2013 | Chan |

OTHER PUBLICATIONS

U.S. Appl. No. 14/331,800, filed Jul. 15, 2014.
Non-final Office Action dated Oct. 26, 2015, U.S. Appl. No. 14/331,784, filed Jul. 15, 2014.
International Search Report & The Written Opinion of the International Searching Authority dated Oct. 22, 2015, International Application No. PCT/US2015/039828.
Response to Office Action dated Feb. 10, 2016, U.S. Appl. No. 14/331,800, filed Jul. 15, 2014.

\* cited by examiner

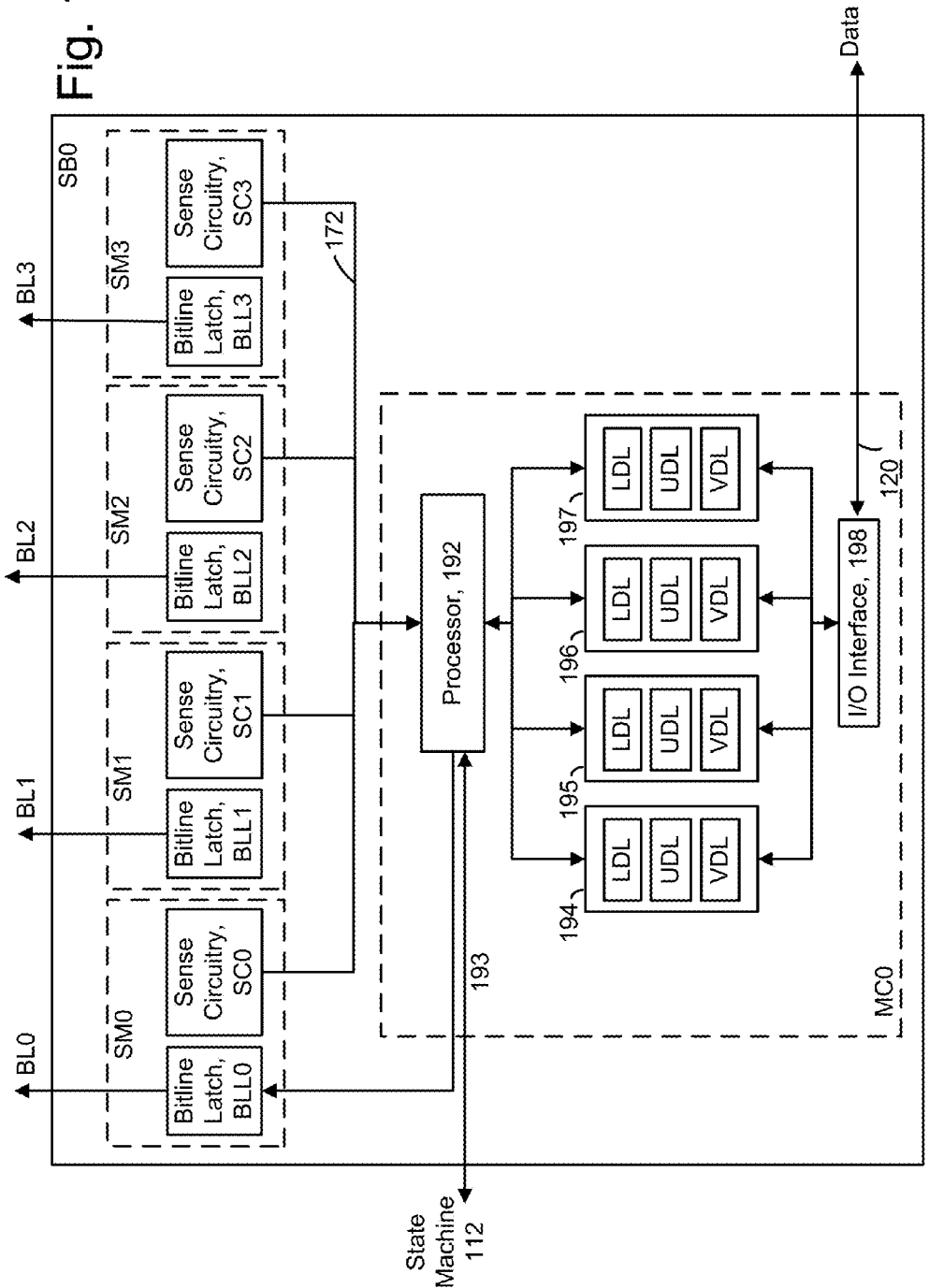

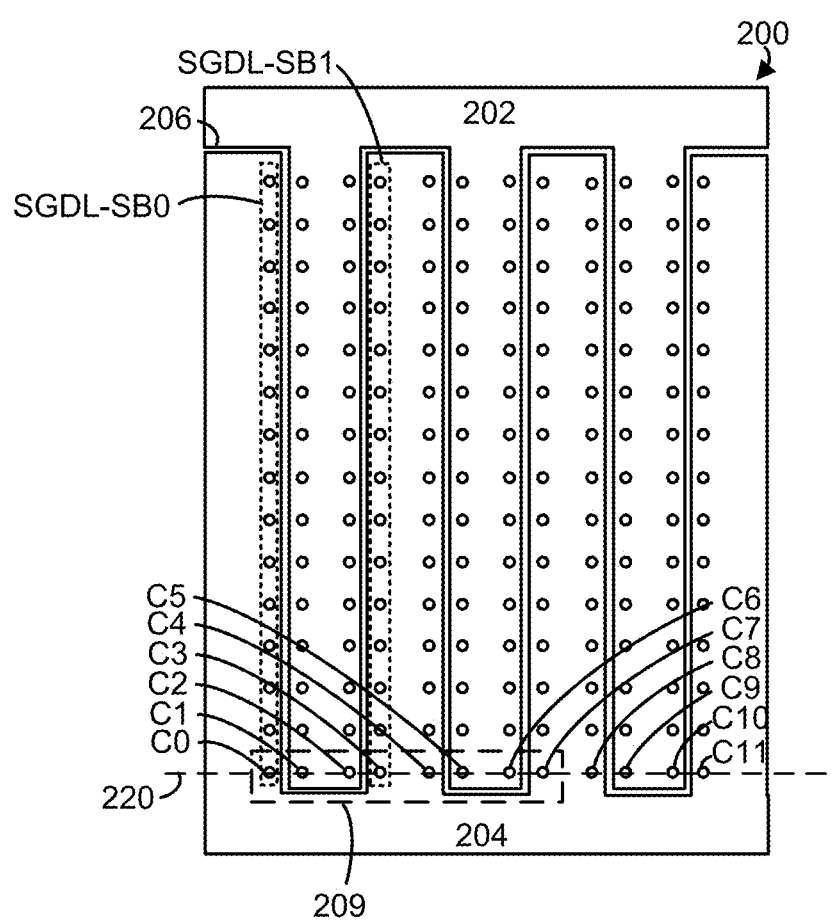

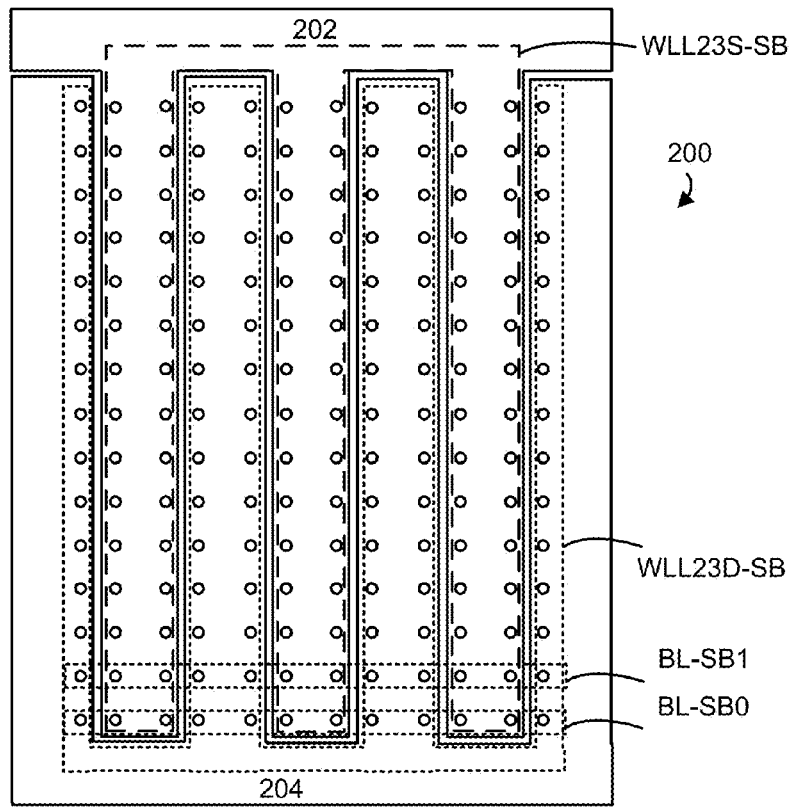
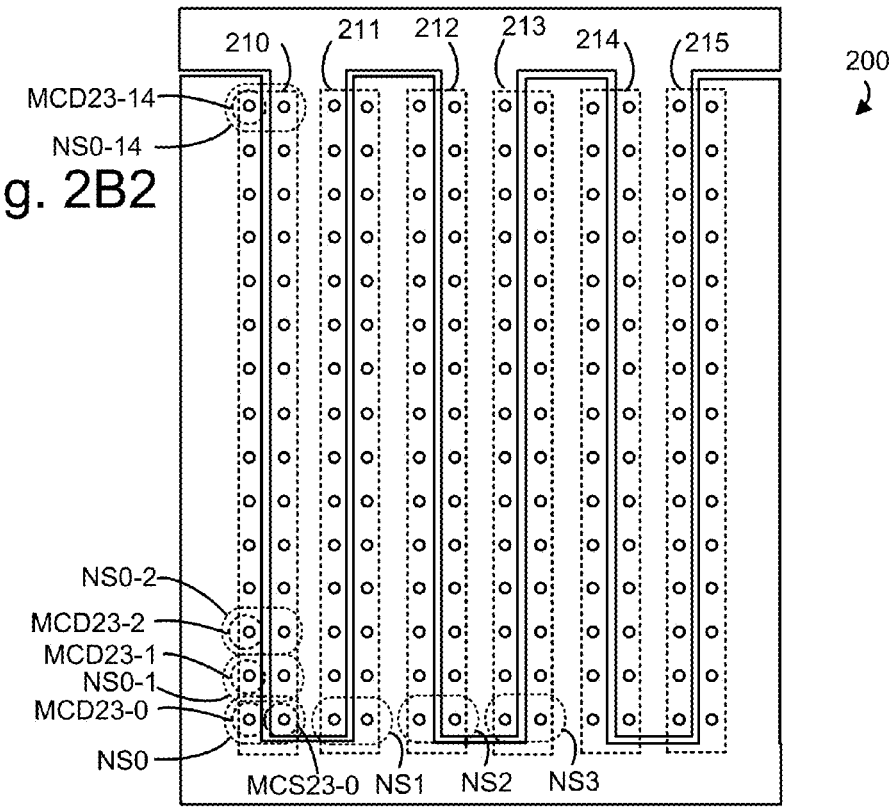
Fig. 2B1
Fig. 2B2

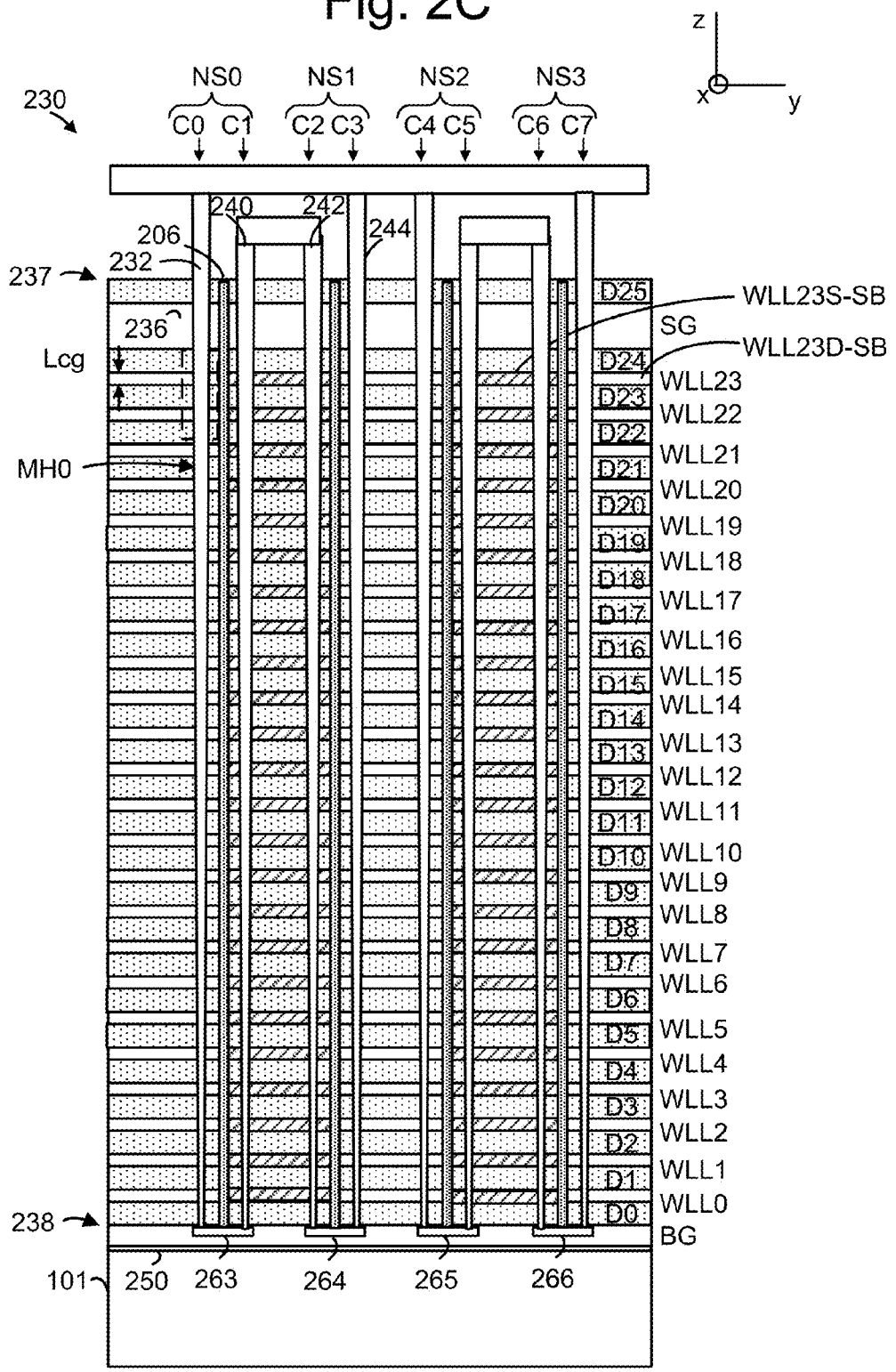

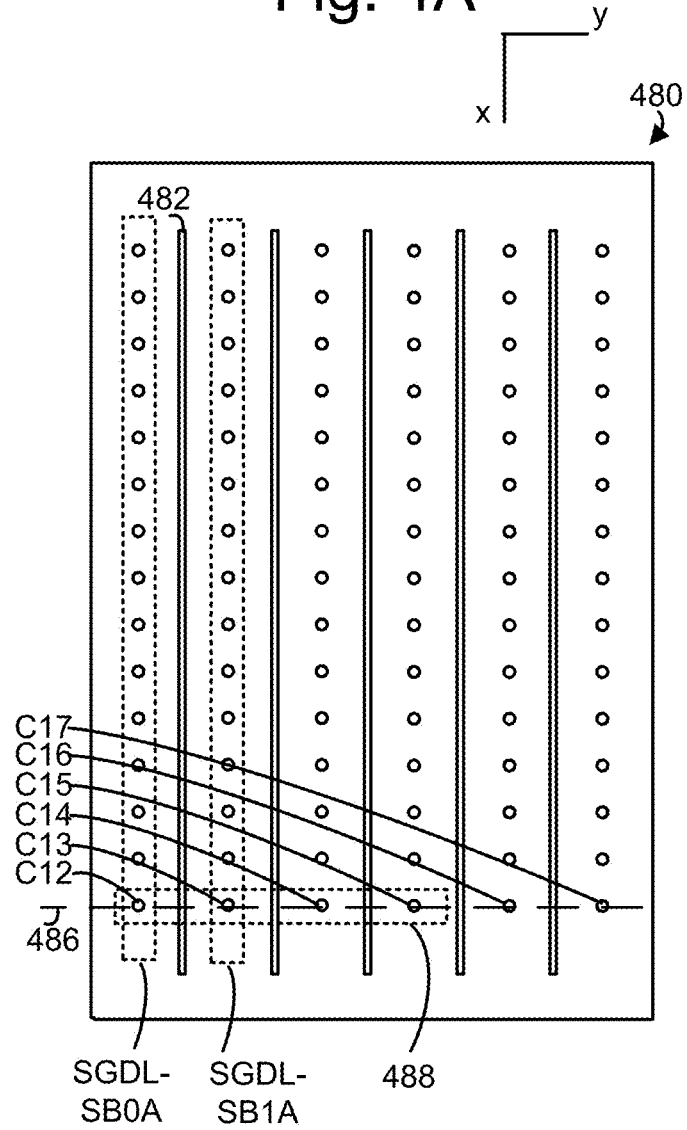

Fig. 4B1
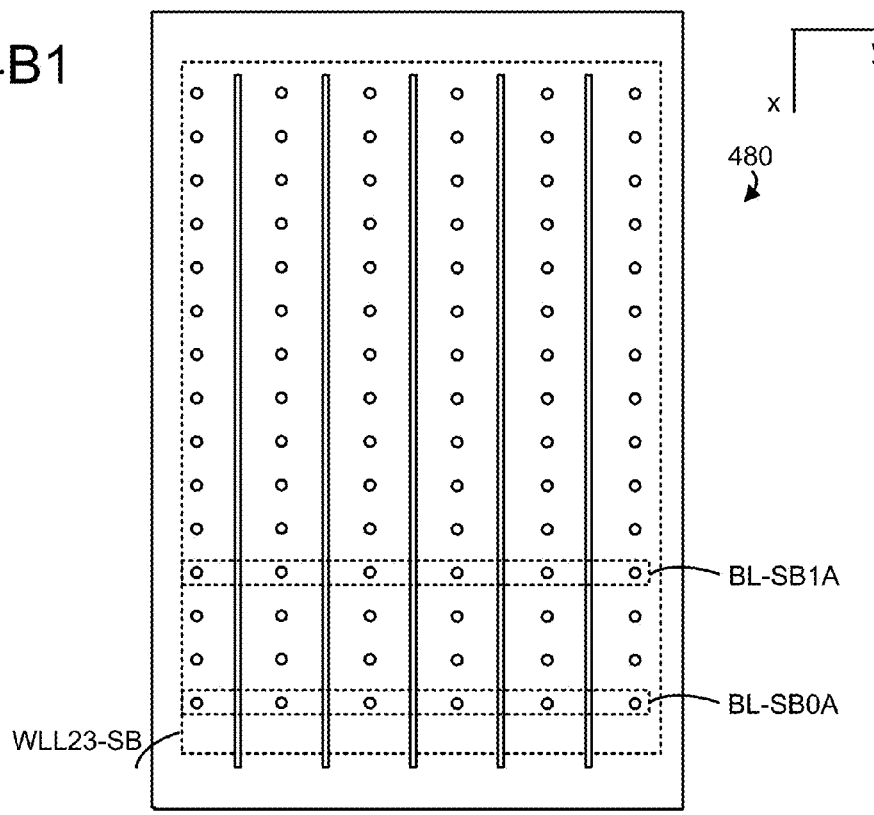
Fig. 4B2
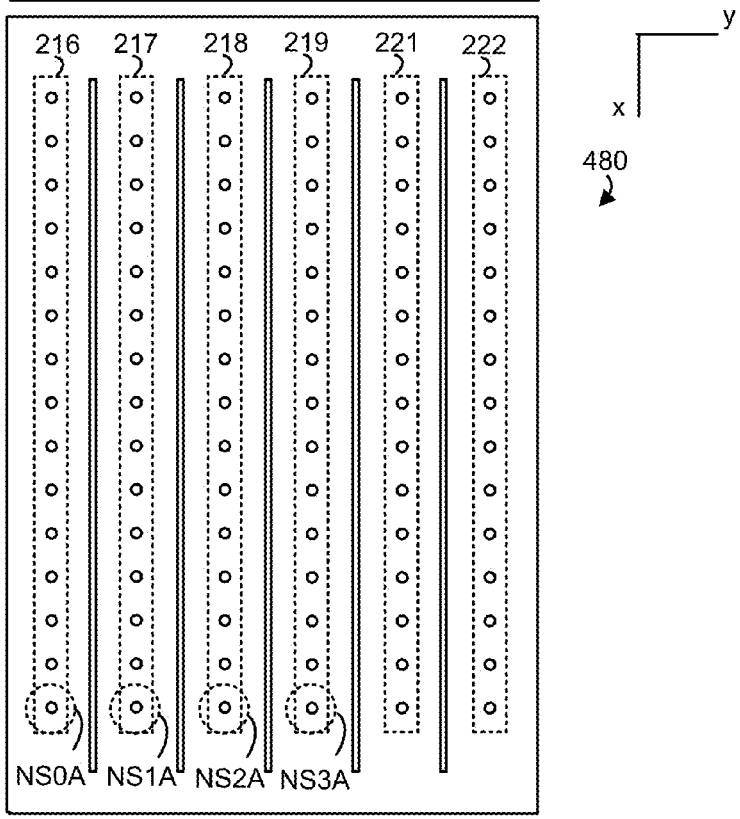

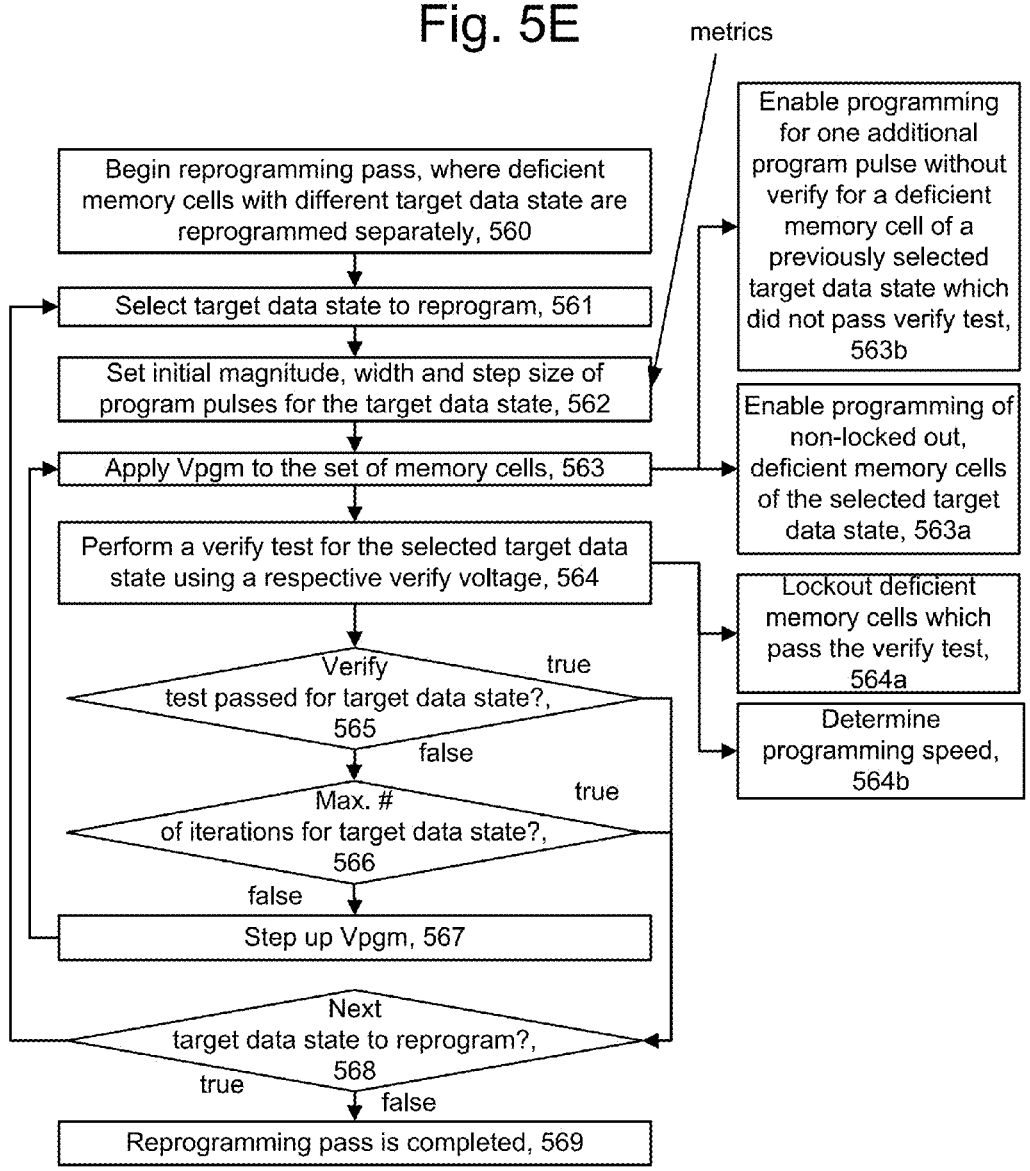

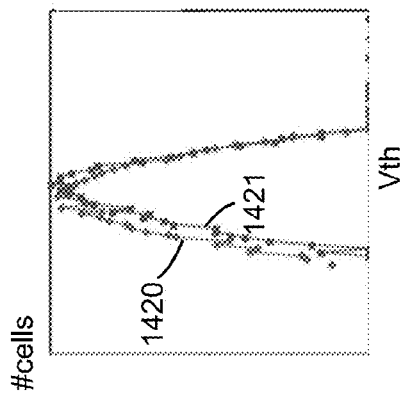
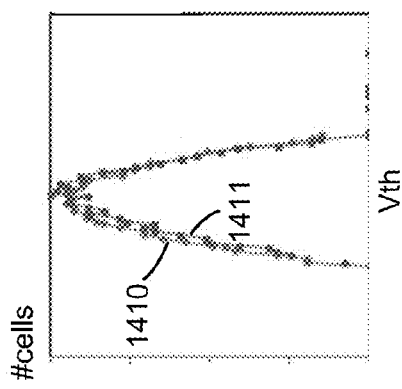
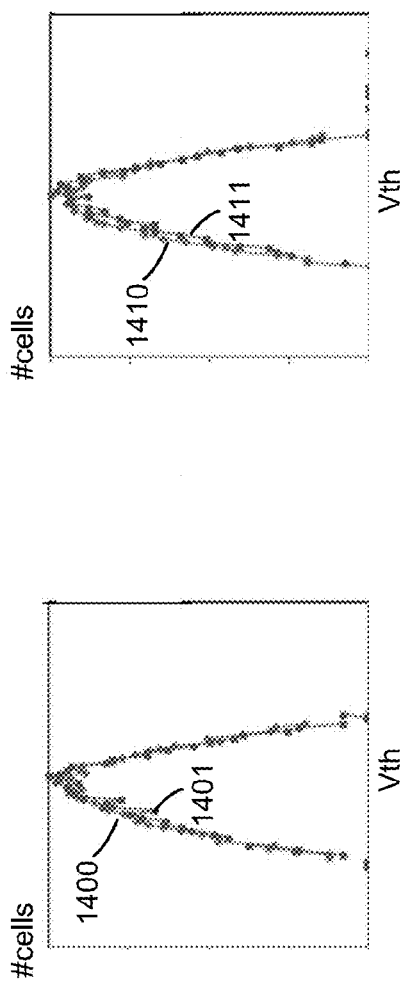
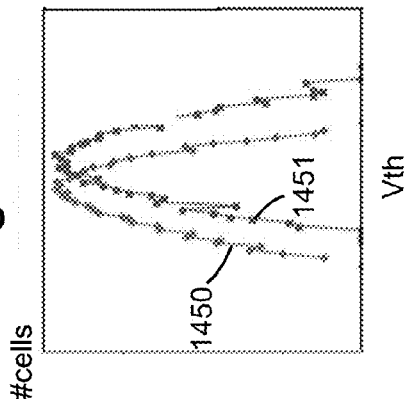
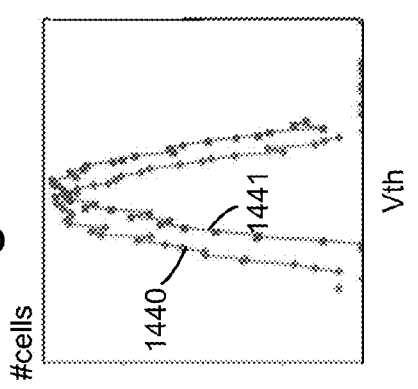
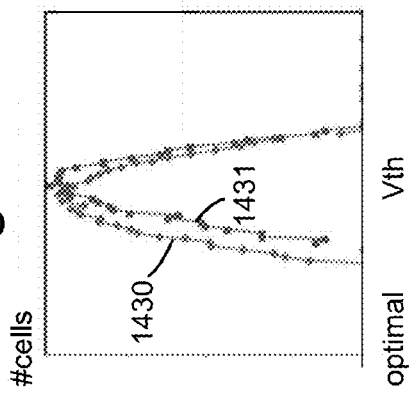

optimal

E state

LDL: 1
UDL: 1
VDL: x

A state program/reprogram
LDL: 0
UDL: 1
VDL: 0

A state passed verify test
LDL: 0
UDL: 1
VDL: 1

Fig. 18C

B state program/reprogram
LDL: 0
UDL: 0
VDL: 0

B state passed verify test
LDL: 0
UDL: 0
VDL: 1

Fig. 18D

C state program/reprogram
LDL: 1
UDL: 0
VDL: 0

C state passed verify test
LDL: 1
UDL: 0
VDL: 1

MULTIPLE PASS PROGRAMMING FOR MEMORY WITH DIFFERENT PROGRAM PULSE WIDTHS

BACKGROUND

The present technology relates to techniques for programming memory cells.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Flash memory is among the most popular type of non-volatile semiconductor memories. With flash memory, the contents of an entire memory array can be erased in one step.

For example, two-dimensional (2D) NAND memory is one type of flash memory in which a floating gate is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Moreover, ultra high density storage devices have been proposed using a three-dimensional (3D) stacked memory structure sometimes referred to as a Bit Cost Scalable (BiCS) architecture. For example, a three-dimensional (3D) NAND stacked memory device can be formed from a stack of alternating conductive and dielectric layers. A memory hole is formed in the layers to define many memory layers simultaneously. A NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1C is a block diagram depicting one embodiment of the sense block SB0 of FIG. 1B.

FIG. 2A depicts a top view of a U-shaped NAND embodiment of a block 200, showing example SGD line subsets SGDL-SB0 and SGDL-SB1, as an example implementation of BLK0 in FIG. 1A.

FIG. 2B1 depicts the block 200 FIG. 2A, showing example word line subsets WL23D-SB and WL23S-SB and example bit line subsets BL-SB0 and BL-SB1.

FIG. 2B2 depicts the block 200 FIG. 2A, showing example sets of NAND strings 210-215.

FIG. 2C depicts an embodiment of a stack 230 showing a cross-sectional view of the portion 209 of the block 200 of FIG. 2A, along line 220.

FIG. 4A depicts a top view of a straight NAND string embodiment (block 480) of the block BLK0 of FIG. 1A, showing example SGD line subsets SGDL-SB0A and SGDL-SB1A.

FIG. 4B1 depicts the block BLK0 of FIG. 4A, showing an example WL line subset WL23-SB and example bit line subsets BL-SB0A and BL-SB1A.

FIG. 4B2 depicts the block BLK0 of FIG. 4A, showing example sets of NAND strings 216-219, 221 and 222.

FIG. 5E depicts an example implementation of reprogramming consistent with steps 532 and 532a in FIG. 5B, where memory cells with different target data states are programmed separately.

FIG. 7A depicts a Vth distribution of memory cells at a start of the programming operation.

FIG. 7B depicts a Vth distribution of memory cells after programming of a lower page of data in a first programming pass.

FIG. 7C depicts a Vth distribution of memory cells after programming of an upper page of data in a second programming pass.

FIG. 8A depicts a starting threshold distribution of an example three-pass programming operation with eight data states.

FIG. 8B depicts a threshold distribution which results after a first pass of the example three-pass programming operation of FIG. 8A.

FIG. 8C depicts a threshold distribution which results after a second pass of the example three-pass programming operation of FIG. 8A.

FIG. 9A depicts a starting threshold distribution of an example one-pass programming operation with eight data states.

FIG. 9B depicts a final threshold distribution of the one-pass programming operation of FIG. 9A.

FIG. 14A to 14F depict Vth distributions after one programming pass and after a one-pulse reprogram, for different program pulse magnitudes.

FIG. 15A to 15F depict Vth distributions after one programming pass and after a one-pulse reprogram, for different program pulse widths.

FIG. 18A depicts a bit combination in a set of latches for an erased memory cell.

FIG. 18B depicts a set of latches for an A-state memory cell, where one bit combination (010) indicates the cell is to be programmed or reprogrammed, and another bit combination (011) indicates the cell has passed a verify test, during one programming pass and/or during a reprogramming.

FIG. 18C depicts a set of latches for a B-state memory cell, where one bit combination (000) indicates the cell is to be programmed or reprogrammed, and another bit combination (001) indicates the cell has passed a verify test, during one programming pass and/or during a reprogramming.

FIG. 18D depicts a set of latches for a C-state memory cell, where one bit combination (100) indicates the cell is to be programmed or reprogrammed, and another bit combination (101) indicates the cell has passed a verify test, during one programming pass and/or during a reprogramming.

DETAILED DESCRIPTION

Figure 1A:
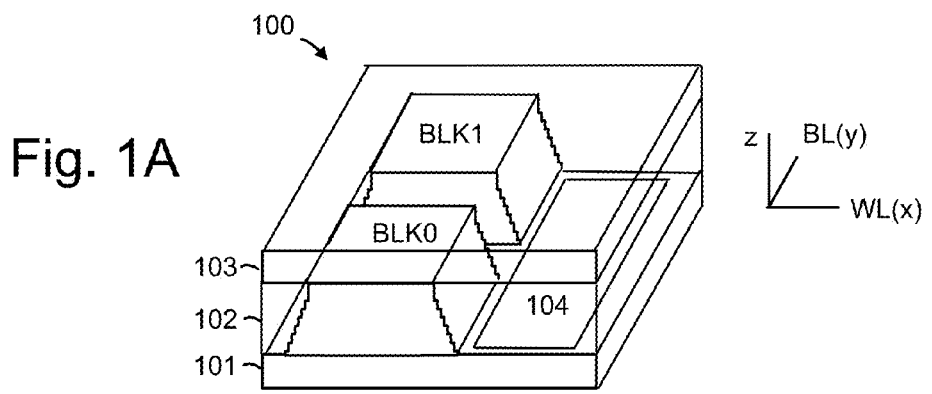
FIG. 1A is a perspective view of a 3D stacked non-volatile memory device.

Techniques are provided for programming memory cells which are subject to charge detrapping, e.g., loss of charge from a charge-trapping layer of a memory cell.

Charge-trapping memory cells store a charge in a charge-trapping layer such as SiN or other nitride. For example, an oxide-nitride-oxide (O—N—O) configuration may be used.

Charge-trapping memory cells can be used in 2D and 3D memory devices. However, short term data-retention loss can be significant in such memory cells. This loss is caused by charge detrapping from shallow traps in the tunnel ONO layers of the memory cells, and can occur very quickly after a programming voltage is applied. Some amount of the detrapping may occur after a programming voltage is applied and before a verify operation is performed. In this case, the memory cell will require one or more additional program pulses to pass the verify test. However, a significant amount of detrapping occurs after the verify operation is performed. In this case, a memory cell may pass a verify test and be locked out from further programming before significant detrapping occurs. As a result, its threshold voltage will be significantly lower when the memory cell is later read. This results in an overall downshift of the threshold voltages of a set of memory cells and broadens the threshold voltage (Vth) distribution. For example, the lower tail of the Vth distribution for each data state may drop by about 0.5-0.8 V below the verify voltage. Charge-trapping memory cells are particularly susceptible to detrapping as compared to floating gate memory cells.

One approach is to program the memory cells to the same verify voltages in two full programming passes. In this case, the memory cells which suffered from a fast charge loss during the first programming pass have a second chance to be programmed. This approach pushes up the lower tail of the Vth distribution so that the Vth distribution becomes narrower. However, programming time is nearly doubled.

Techniques provided herein reduce the effects of detrapping and thereby reduce downshifting and broadening of the Vth distribution, with a relatively small increase in programming time. In one aspect, one programming pass is performed until it has been completed. For example, the pass can be completed when all, or most, memory cells being programmed have passed a verify test which indicates that their Vth has exceeded a verify voltage of a respective target data state. Subsequently, a further verify test is performed, in a detrapping evaluation process, to identify memory cells for which reprogramming is warranted. These are deficient memory cells. For example, the memory cells which do not pass the verify test of their target data state in the detrapping evaluation process can be identified for reprogramming. The deficient memory cells can include memory cells which previously passed a verify test in the one programming pass but subsequently experienced detrapping which lowered their Vth. The deficient memory cells can include memory cells which did not previously pass a verify test in the one programming pass can also be reprogrammed. These are generally very hard to program memory cells and referred to as fail bits. For a target data state, the verify test which identifies whether reprogramming is warranted can be the same as, or different than, the verify test during the one programming pass.

The reprogramming can be a reprogramming pass which includes multiple program-verify iterations (incremental step pulse reprogramming) in which each program pulse width is optimized to tighten the Vth distribution with fewer program-verify iterations than in the one programming pass. As a result, the reprogramming results in a relatively small increase in programming time. In one approach, a single staircase progression of program pulses is used to reprogram the deficient memory cells, where this single staircase progression is optimized in terms of initial magnitude, step size and program pulse width, across all target data states. In another approach, a separate set of program-verify iterations is used for each target data state. Within each separate set of program-verify iterations, a respective staircase progression of program pulses is used to program the deficient memory cells, where this staircase progression is optimized in terms of initial magnitude, step size and program pulse width, for the respective target data state. In a related aspect, a memory cell which does not pass a verify test in one of the sets of program-verify iterations is allowed to be programmed by one additional program pulse, without verify, of a program-verify iteration of another of the sets of program-verify iterations.

In another aspect, a metric of programming speed or a number of deficient memory cells can be determined in the one programming pass and used to set the program pulse initial magnitude, step size and pulse width in the reprogramming.

In another aspect, a metric of programming speed or a number of deficient memory cells can be determined for one target data state in the reprogramming pass and used to set the program pulse initial magnitude, step size and pulse width for another target data state in the reprogramming.

In another aspect, the reprogramming includes one program pulse for each target data state (a one-pulse per target data state reprogramming), where the program pulse width and magnitude are optimized to tighten the Vth distribution for the respective target data state and no verify test is performed. This reprogramming results in a very small increase in programming time while still achieving a significant narrowing of the Vth distributions.

The reprogramming can narrow the Vth distributions by raising a lower tail of each Vth distribution without increasing an upper tail.

Latches associated with the memory cells can be configured to indicate whether a memory cell should be subject to reprogramming.

Advantages of the above-mentioned techniques include reducing downshifting and broadening of the Vth distribution of a set of memory cells due to detrapping.

The following discussion provides details of the construction of a memory device and of related programming and sensing techniques which address the above-mentioned issues.

FIG. 1A is a perspective view of a 3D stacked non-volatile memory device. As mentioned, one example of a charge-trapping memory device is a 3D memory device in which the memory cells are arranged in a 3D structure.

The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
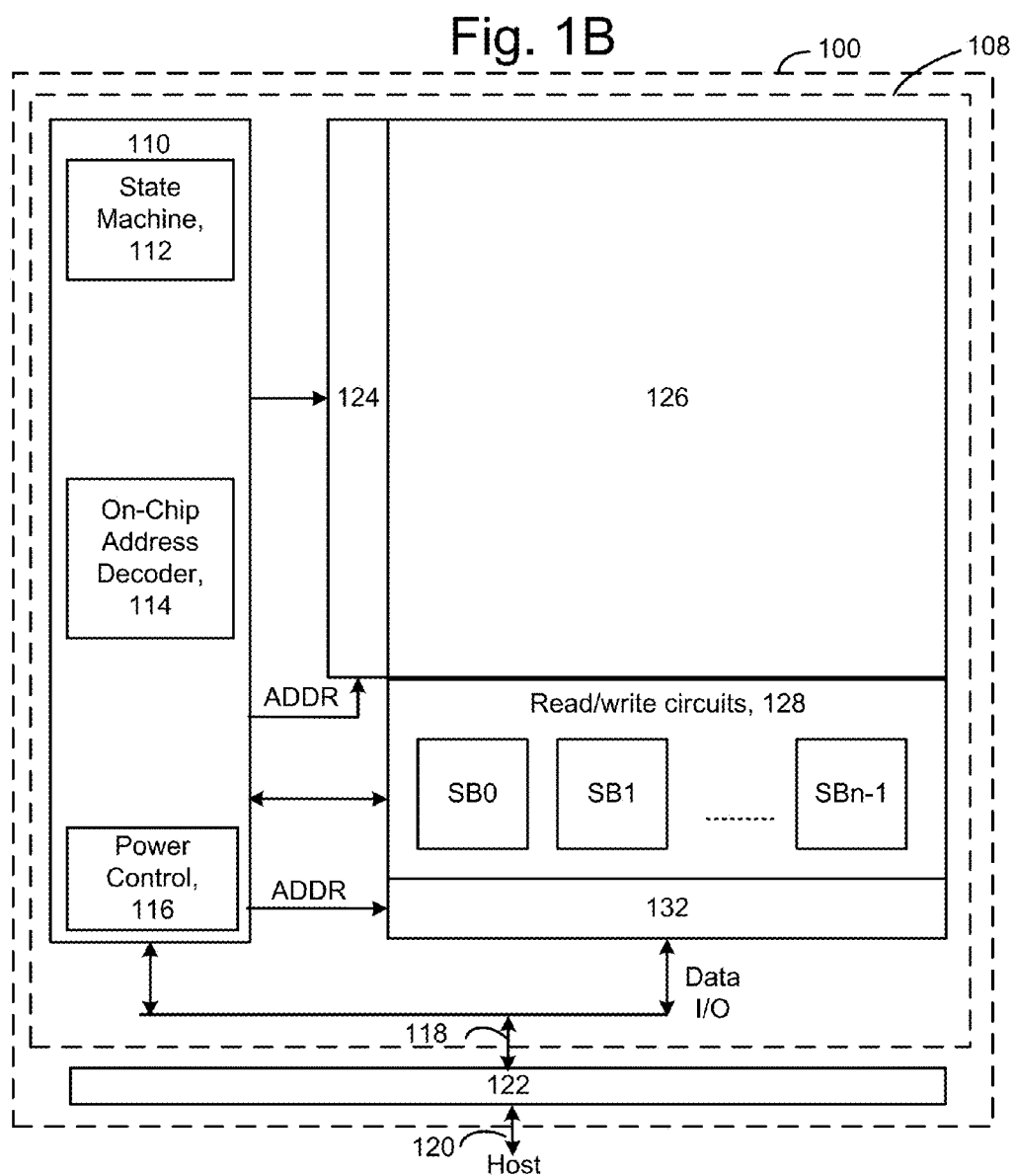
FIG. 1B is a block diagram of a memory device which can be used to provide a 3D stacked non-volatile memory device such as depicted in FIG. 1A or a 2D memory device such as depicted in FIG. 5A.
Figure 5A:
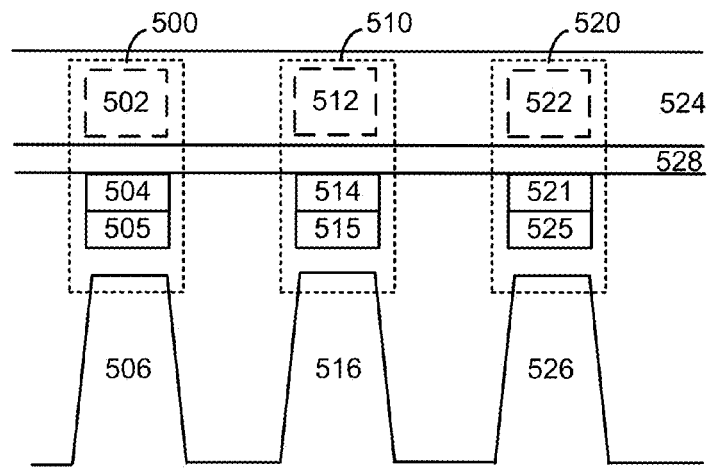
FIG. 5A depicts a cross-sectional view of memory cells comprising a flat control gate and charge-trapping regions as another example of memory cells in the memory structure 126 of FIG. 1B.

FIG. 1B is a block diagram of a memory device which can be used to provide a 3D stacked non-volatile memory device such as depicted in FIG. 1A or a 2D memory device such as depicted in FIG. 5A. The memory device 100 may include one or more memory die 108. The memory die 108 includes memory structure 126 of memory cells (e.g., including the blocks BLK0 and BLK1), control circuitry 110, and read/write circuits 128. The memory structure 126 is addressable by word lines via a row decoder 124 and by bit lines via a column decoder 132. The read/write circuits 128 include multiple sense blocks SB0, SB1, . . . , SBn−1 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via data bus 120 and between the controller and the one or more memory die 108 via lines 118.

The memory structure may comprise one or more array of memory cells including a 2D or a 3D array. The memory structure may comprise a monolithic three dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for WLLs, drain- and source-side select gate drivers (referring, e.g., to drain- and source-sides or ends of a string of memory cells such as a NAND string, for instance) and source lines. The sense blocks can include bit line drivers, in one approach.

In some implementations, some of the components can be combined. In various designs, one or more of the components (alone or in combination), other than memory structure 126, can be thought of as at least one control circuit or as control circuitry. For example, a control circuit may include any one of, or a combination of, control circuitry 110, state machine 112, decoders 114/132, power control module 116, sense blocks (SB0, including the processor 192 and managing circuit MC0 in FIG. 1C), read/write circuits 128, and controller 122, and so forth. The sense block SB0 is discussed further in connection with FIG. 1C.

In another approach, a non-volatile memory system uses dual row/column decoders and read/write circuits. Access to the memory structure by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory structure 126. In this way, the density of the read/write modules is reduced by one half.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 1C is a block diagram depicting one embodiment of the sense block SB0 of FIG. 1B. The sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194, 195, 196 and 197 and an I/O interface 198 coupled between the sets of data latches and a data bus 120. One set of data latches can be provide for each sense module, and may include data latches identified by LDL, UDL and VDL. LDL stores a bit for a lower page (LP) of write data, and UDL stores a bit for an upper page (UP) of write data, in a memory which stores two bits of data in each memory cell. VDL stores a verify data bit which identifies a memory cell which has passed a verify test.

Additional data latches could be used as well. For example, in a three-bit per memory cell implementation, one extra data latch may be used to store a middle page (MP) of data. A four-bit per memory cell implementation can use lower-middle and upper-middle data latches. The techniques provided herein are meant to encompass such variations.

The processor 192 performs computations during reading and programming. For reading, the processor determines the data state stored in the sensed memory cell and stores the data in the set of data latches. For programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrA, VrB and VrC in FIG. 6B) corresponding to the various memory states supported by the memory (e.g., states A, B and C), the sense module may trip at one of these voltages and a corresponding output will be provided from the sense module to the processor 192 via the bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the data latches 194-197. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses applied to the control gates of the addressed memory cells. Each programming voltage is followed by a read back (verify) to determine if the memory cell has been programmed to the desired memory state. In some cases, processor monitors the read back memory state relative to the desired memory state. When the two states agree, the processor sets the bit line latch to cause the bit line to be pulled to a state designating program inhibit. This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated memory cell has reached certain mileposts in a programming operation. For example, data latches may identify that the Vth of a memory cell is below a particular verify voltage. The data latches indicate whether a memory cell currently stores one or more bits from a page of data. For example, an LP data latch is flipped (e.g., from 0 to 1) when a lower page bit is stored in an associated memory cell. An UP data latch is flipped when an upper page bit is stored in an associated memory cell. The flipping of a bit occurs when an associated memory cell completes programming, e.g., when its Vth exceeds a target verify voltage. When lower, middle and upper page bits are used (e.g., in case of three-bit per memory cell memory), the MP data latch is also flipped when a middle page bit is stored in an associated memory cell. Additional information regarding the setting of bit combinations in the data latches is discussed further below.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple WLLs in a stack. Referring also to FIG. 2C, the stack includes alternating dielectric and conductive layers. The dielectric layers include D0 to D25 and may be made of SiO2, for instance. The conductive layers include BG, which is a back gate layer, WLL0 to WLL23, which are conductive paths to control gates of the memory cells at the layer, and SG, which is a select gate layer, e.g., a conductive path to control gates of select gate transistors of NAND strings. FIG. 2A may represent any one of WLL0 to WLL23, for instance, in an example with twenty-four WLLs. The conductive layers may include doped polysilicon, metal silicide or a metal, for instance. An example voltage of 5-10 V may be applied to the back gate to maintain a conductive state which connects the drain- and source-side columns.

For each block, the WLL is divided into two portions 202 and 204. Each block includes a slit pattern. A slit is a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the WLL portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

A portion 209 of the block is depicted in further detail in connection with FIG. 2C.

FIG. 2B1 depicts the block 200 FIG. 2A, showing example word line subsets WL23D-SB and WL23S-SB and example bit line subsets BL-SB0 and BL-SB1. This example assumes that the WLL23 layer is depicted. WLL23S-SB is a WLL portion in communication with one memory cell in the source-side of each U-shaped NAND string, and WLL23D-SB is a WLL portion in communication with one memory cell in the drain-side of each U-shaped NAND string.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the WLL portions 202 and 204.

The drawings are not to scale and do not show all memory columns. For example, a more realistic block might have twelve memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assuming there are twenty-four memory cells per column, there are 384 k×24=9,216 k memory cells in the set. Sets of NAND strings 210-215 are also depicted.

FIG. 2B2 depicts the block 200 FIG. 2A, showing example sets of NAND strings 210-215. The set of NAND strings 210 includes an example NAND string NS0, such as depicted in FIG. 2B5 and example memory cells MCD23-0, MCD23-1, MCD23-2, . . . , MCD23-14, as depicted in FIG. 2B6. In this notation, "MC" denotes a memory cell, "D" denotes a drain side of the NAND strings, and the number (0, 1, 2, . . . , 14) denotes a number of the NAND string based on its position in the stack. NAND strings NS0, NS0-1, NS0-2, . . . , NS0-14 are also depicted.

FIG. 2C depicts an embodiment of a stack 230 showing a cross-sectional view of the portion 209 of the block 200 of FIG. 2A, along line 220. In one approach, the WLLs have a uniform thickness and the memory holes have another uniform thickness. Lcg represents a control gate length for the memory cells, which is the same as the thickness or height of each WLL. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263, and has a drain end 232 and a source end 240. NS1 includes columns C2 and C3 and connecting portion 264, and has a drain end 244 and a source end 242. NS2 includes columns C4 and C5 and connecting portion 265. NS3 includes columns C6 and C7 and connecting portion 266.

MH0, corresponding to C0, is depicted for reference. The memory hole is shown as becoming progressively and gradually narrower from the top 237 to the bottom 238 of the stack. The memory holes are columnar and extend at least from a top word line layer (WLL23) of the plurality of WLLs to a bottom word line layer (WLL0) of the plurality of WLLs. Each word line layer provides a word line.

The source line SL0 is connected to the source ends 240 and 242 of two adjacent memory strings NS0 and NS1. SL0 is also connected to other sets of memory strings which are behind NS0 and NS1 in the x direction. Additional U-shaped NAND strings in the stack 230 (e.g., NS0-1, NS0-2, . . . , NS0-14 from FIG. 2B6) extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit 206 from FIG. 2A is also depicted as an example. In the cross-section, multiple slit portions are seen, where each slit portion is between the drain- and source-side columns of a U-shaped NAND string. A portion of the bit line BL0 is also depicted.

Figure 3A:
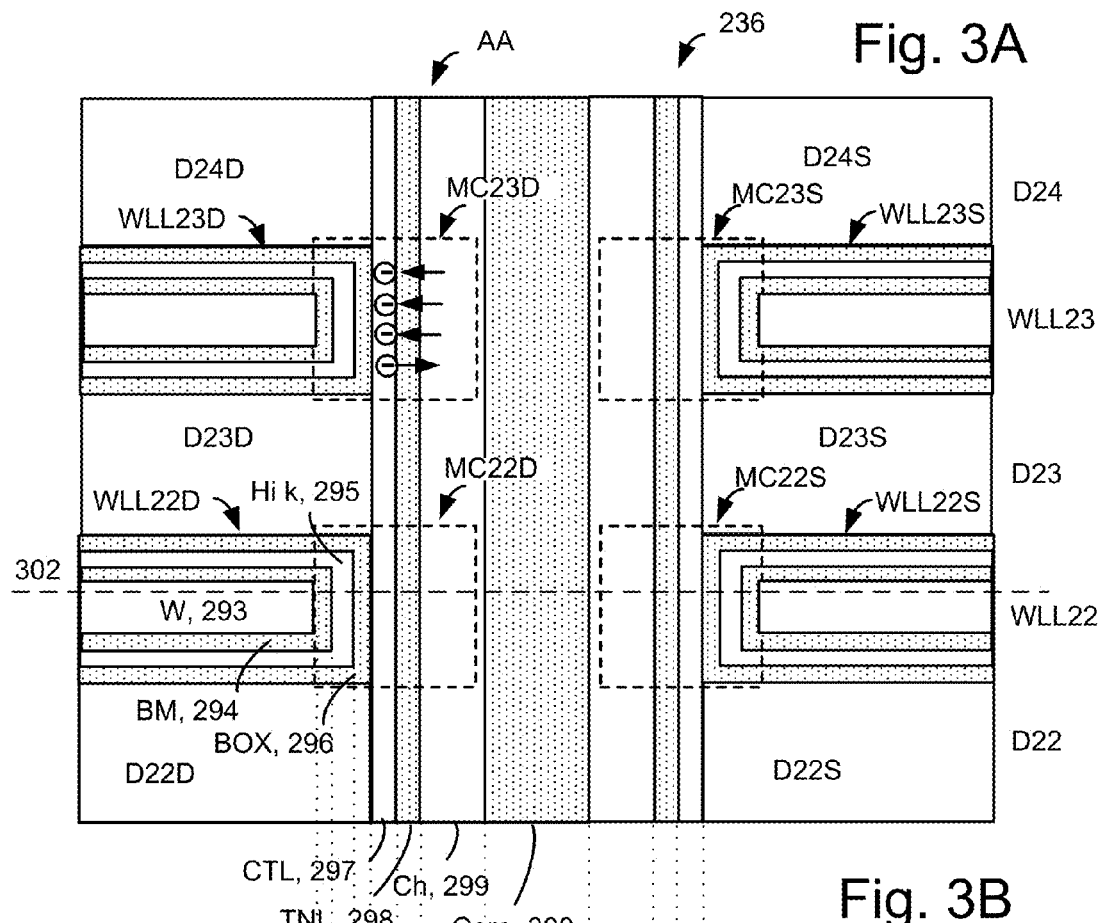
FIG. 3A depicts a close-up view of the region 236 of the column C0 of FIG. 2C, showing example memory cells MC23D, MC22D, MC23S and MC22S.

A region 236 of the stack is shown in greater detail in FIG. 3A.

Word line layers WLL0-WLL23 and dielectric layers D0-D24 extend alternatingly in the stack. The SG layer is between D24 and D2. Each WLL has a drain-side portion and a source-side portion. For example, WL23S-SB is a source-side sub-block of WLL23, and WL23D-SB is a drain-side sub-block of WLL23, consistent with FIG. 2B1. In each WLL, the diagonal line patterned region represents the source-side sub-block, and the unpatterned region represents the drain-side sub-block.

FIG. 3A depicts a close-up view of the region 236 of the column C0 of FIG. 2C, showing example memory cells MC23D, MC22D, MC23S and MC22S. The region also shows portions D24D and D24S of the dielectric layer D24, portions D23D and D23S of the dielectric layer D23, and portions D22D and D22S of the dielectric layer D22. The region also shows portions WLL24D and WLL24S of the conductive layer WLL24, portions WLL23D and WLL23S of the conductive layer WLL23, and portions WLL22D and WLL22S of the conductive layer WLL22.

A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 297 such as SiN or other nitride, a tunnel oxide (TNL) 298, a polysilicon body or channel (CH) 299, and a core filler dielectric 300. The word line layer includes a block oxide (BOX) 296, a block high-k material 295, a barrier metal 294, and a conductive metal such as W 293. In another approach, all of these layers except the W are provided in the column. Additional memory cells are similarly formed throughout the columns. These layers form a columnar active area (AA) of the NAND string.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge.

Each respective memory cell of the first set of memory cells is adjacent to, and is arranged along a common charge-trapping layer with, a respective memory cell of the second set of memory cells. For example, MC23D is adjacent to, and is arranged along a common charge-trapping layer 297 with, MC22D. Also, MC23S is adjacent to, and is arranged along a common charge-trapping layer 297 with, MC22S.

Circles in the CTL represent charges (electrons) in MC23D. The arrows pointing to the left indicate charges which are drawn into the CTL and the arrow pointing to the right indicates a charge which is detrapped out of the CTL.

Figure 3B:
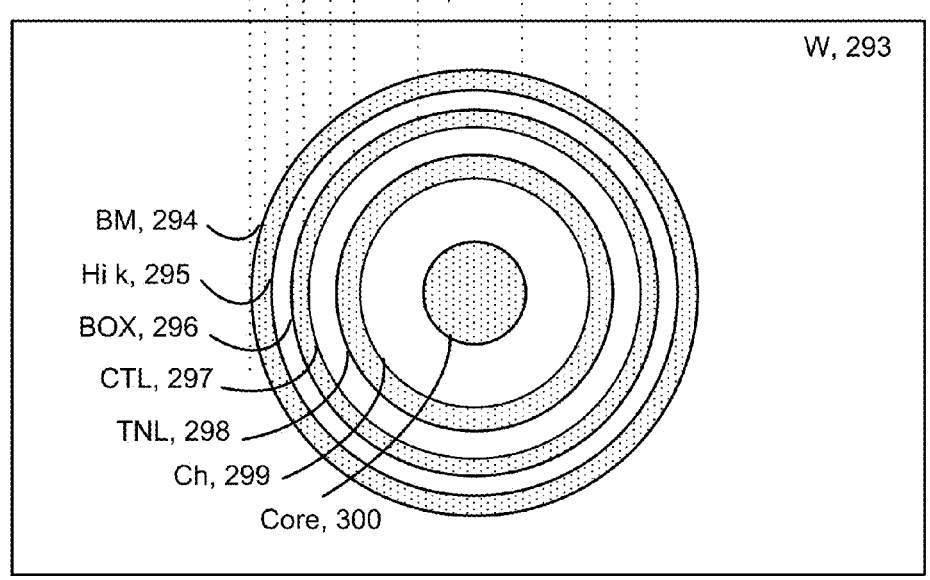
FIG. 3B depicts a cross-sectional view along line 302 of FIG. 3A.

FIG. 3B depicts a cross-sectional view along line 302 of FIG. 3A. Each layer is ring-shaped in one possible approach, except the core filler, which is a cylinder.

Figure 3C:
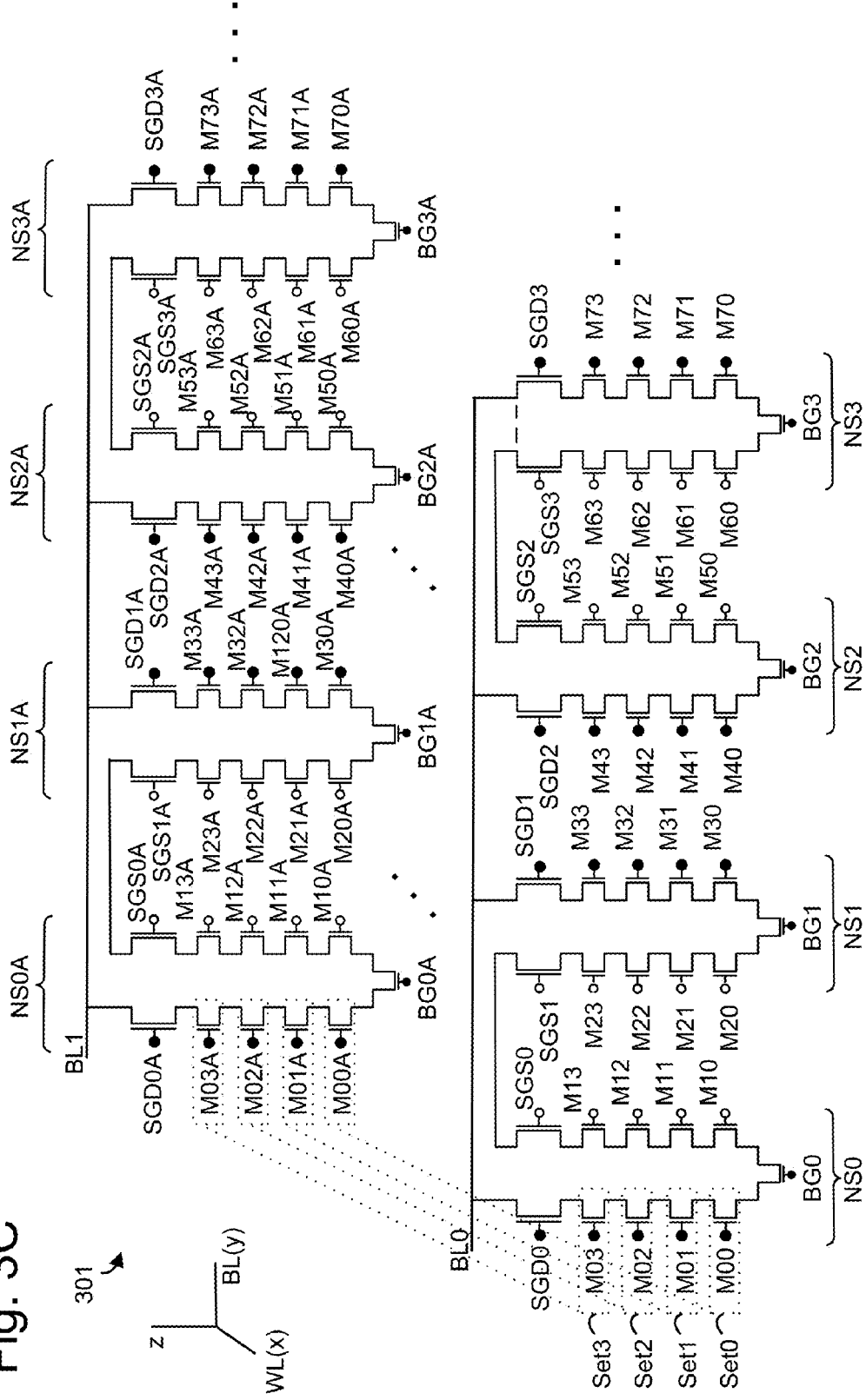
FIG. 3C depicts one embodiment of a circuit 301 in a 3D stacked non-volatile memory device.

FIG. 3C depicts one embodiment of a circuit 301 in a 3D stacked non-volatile memory device. As a simplification, four memory cells are provided per column.

NAND strings NS0, NS1, NS2 and NS3 are in communication with a bit line BL0, and NAND strings NS0A, NS1A, NS2A and NS3A are in communication with a bit line BL1. In this example, each NAND string has a drain-side column with four memory cells and a SGD transistor, and a source-side column with four memory cells and a SGS transistor. The filled in circles indicate control gates of the select transistor and the memory cells on the drain side of a NAND string. The open circles indicate control gates of the select transistor and the memory cells on the source side of a NAND string.

For example, NS0 has a drain side column C0D comprising memory cells M00, M01, M02 and M03 and an SGD transistor SGD0, and a source side column C0S comprising memory cells M10, M11, M12 and M13 and an SGS transistor SGS0. NS1 has a drain side comprising memory cells M30, M31, M32 and M33 and an SGD transistor SGD1, and a source side comprising memory cells M20, M21, M22 and M23 and an SGS transistor SGS1. NS2 has a drain side comprising memory cells M40, M41, M42 and M43 and an SGD transistor SGD2, and a source side comprising memory cells M50, M51, M52 and M53 and an SGS transistor SGS2. NS3 has a drain side comprising memory cells M70, M71, M72 and M73 and an SGD transistor SGD3, and a source side comprising memory cells M60, M61, M62 and M63 and an SGS transistor SGS3.

Similarly, NS0A has a drain side comprising memory cells M00A, M01A, M02A and M03A and an SGD transistor SGD0A, and a source side comprising memory cells M10A, M11A, M12A and M13A and an SGS transistor SGS0A. NS1A has a drain side comprising memory cells M30A, M31A, M32A and M33A and an SGD transistor SGD1A, and a source side comprising memory cells M20A, M21A, M22A and M23A and an SGS transistor SGS1A. NS2A has a drain side comprising memory cells M40A, M41A, M42A and M43A and an SGD transistor SGD2A, and a source side comprising memory cells M50A, M51A, M52A and M53A and an SGS transistor SGS2A. NS3A has a drain side comprising memory cells M70A, M71A, M72A and M73A and an SGD transistor SGD3A, and a source side comprising memory cells M60A, M61A, M62A and M63A and an SGS transistor SGS3A.

Each NAND string has a back gate (BG0 for NS0, BG1 for NS1, BG2 for NS2, BG3 for NS3, BG0A for NS0A, BG1A for NS1A, BG2A for NS2A, BG3A for NS3A). The control gates of all of the back gates in the circuit may be connected to one another.

In one approach, the source side of each SGS transistor is connected to a common source line of the circuit.

A sets of memory cells includes cells that can be programmed or read together. For example, a set of memory cells can include cells connected to a common word line layer (WLL) portion and to a common SGD line. For example, Set0 includes cells M00-M00A, Set1 includes cells M01-M01A, Set2 includes cells M02-M02A, and Set3 includes cells M03-M03A.

At each level of the circuit, the control gates of the drain-side memory cells are connected to one another by a common WLL. For example, at the top WLL, M03, M03A, M33, M33A, M43, M43A, M73 and M73A have control gates connected by a word line layer. Similarly, the control gates of the source-side memory cells are connected to one another by a common WLL. For example, at the top WLL, M13, M13A, M23, M23A, M53, M53A, M63 and M63A have control gates connected by a word line layer.

Additionally, control gates of the SGD transistors are connected to one another. For example, control gates of SGD0, . . . , SGD0A are connected, control gates of SGD1, . . . , SGD1A are connected, control gates of SGD2, . . . , SGD2A are connected, and control gates of SGD3, . . . , SGD3A are connected.

The control gates of the SGS transistors are connected to one another in the x-direction. For example, control gates of SGS0, . . . , SGS0A are connected, control gates of SGS1, . . . , SGS1A are connected, control gates of SGS2, . . . , SGS2A are connected, and control gates of SGS3, . . . , SGS3A are connected.

FIG. 4A depicts a top view of a straight NAND string embodiment (block 480) of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one WLL which is connected to each of the memory cells of the layer.

Figure 4C:
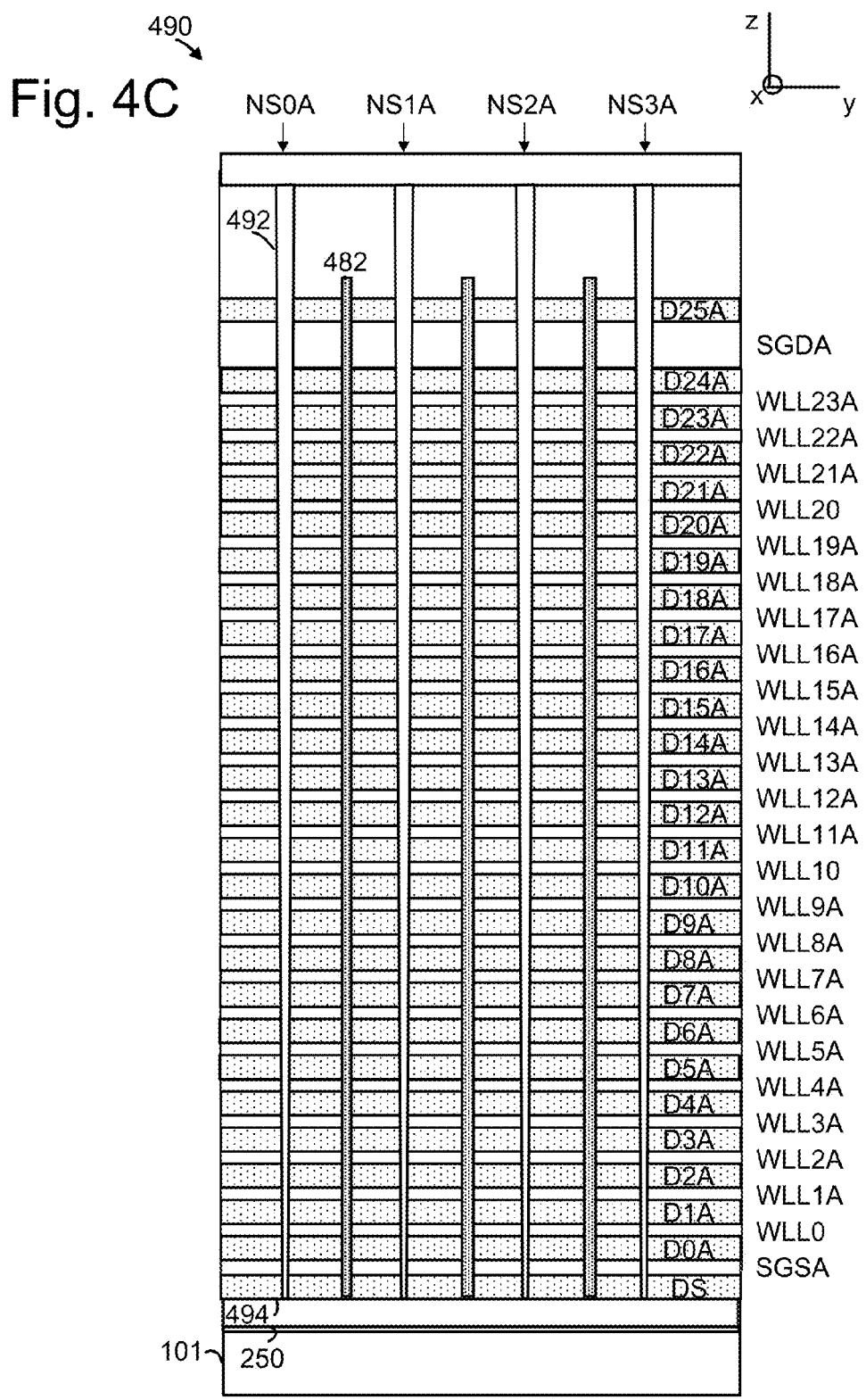
FIG. 4C depicts a cross-sectional view of the portion 488 of the block 480 of FIG. 4A along line 486.

For example, FIG. 4B1 depicts the block BLK0 of FIG. 4A, showing an example WL line subset WL23-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

FIG. 4B2 depicts the block BLK0 of FIG. 4A, showing example sets of NAND strings 216, 217, 218, 219, 221 and 222. Example NAND strings NS0A-NS3A in the portion 488 are also depicted.

FIG. 4C depicts a cross-sectional view of the portion 488 of the block 480 of FIG. 4A along line 486. Columns of memory cells corresponding to NAND strings NS0A-NS3A in FIG. 4B2 are depicted in the multi-layer stack. In the portion, a stack 490 which includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS0A has a source end 494 and a drain end 492. The slit 482 from FIG. 4A is also depicted with other slits. A portion of the bit line BL0A is also depicted. Dashed lines depict memory cells and select gate transistors. The techniques described herein can be used with a U-shaped or straight NAND. Word line layers WLL0-WLL23A are arranged alternatingly with dielectric layers D0A-D24A in the stack. An SGD layer, SGDA, an SGS layer, SGSA, and an additional dielectric layer DS are also depicted. SGDA is between D24A and D25A.

FIG. 5A depicts a cross-sectional view of memory cells comprising a flat control gate and charge-trapping regions as another example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521 and polysilicon layers 505, 515 and 525.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region

516. A memory cell 520 includes the control gate 522, the charge-trapping layer 521, the polysilicon layer 525 and a portion of the channel region 526.

The flat control gate is used instead of a control gate that wraps around a floating gates. One advantage is that the charge-trapping layer can be made thinner than a floating gate. Additionally, the memory cells can be placed closer together.

Figure 5B:
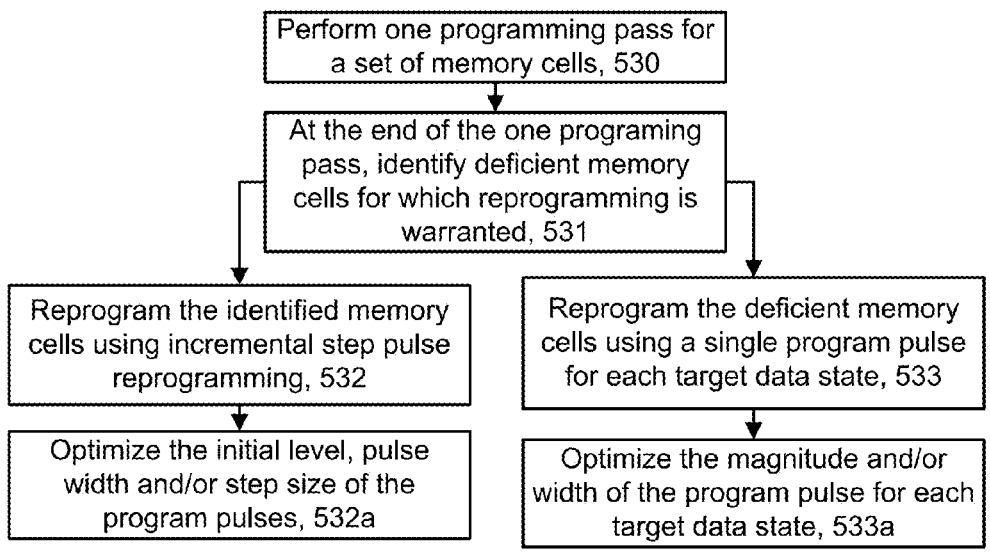
FIG. 5B depicts a process for programming memory cells in a memory device.

FIG. 5B depicts a process for programming memory cells in a memory device. Step 530 involves performing one programming pass for a set of memory cells. At step 531, at the end of the one programming pass, an identification is made of deficient memory cells for which additional programming is warranted, in a detrapping evaluation process. For example, this can involve reading a memory cell at the same verify voltage which was previously used in the programming pass to determine whether the memory cell has reached its target data state. If the Vth of the memory cell is below the verify voltage, detrapping has occurred which caused the Vth to fall below the verify voltage. Or, the memory cell is a fail bit for which the Vth did not exceed the verify voltage in the programming pass. Optionally, a verify voltage used to identify a deficient memory cell is lower or higher than the verify voltage which was previously used in the programming pass.

Subsequently, one of two paths can be followed. In one path, step 532 involves reprogramming the identified memory cells using incremental step pulse reprogramming in which one or more staircase progressions of program voltages are applied to the deficient memory cells. Each staircase progression has an initial magnitude and a step size. Step 532a indicates that an initial value, a pulse width and/or a step size of the program pulses in the reprogramming are optimized for the reprogramming. At least one of the initial value, a pulse width and/or a step size of the program pulses in the reprogramming is different than in the prior programming pass. The reprogramming can involve multiple program-verify iterations in which deficient memory cells of all target data states are programmed concurrently or memory cells of different target data states are programmed separately, as discussed further below. The memory cells which are not identified as being deficient are not programmed during the reprogramming. The incremental step pulse reprogramming continues until a verify test is passed or a maximum number of program-verify iterations has been performed.

In a second path, step 533 performs reprogramming for the identified memory cells using a single additional program pulse for each target data state, e.g., one program pulse per data state. Step 533a indicates that a magnitude and/or width of the program pulse is optimized for each target data state. At least one of the magnitude and/or the width of the program pulse is different than in the prior programming pass. The single additional program pulse can involve exactly (only) one program pulse per target data state which is not followed by a verify operation.

Figure 5C:
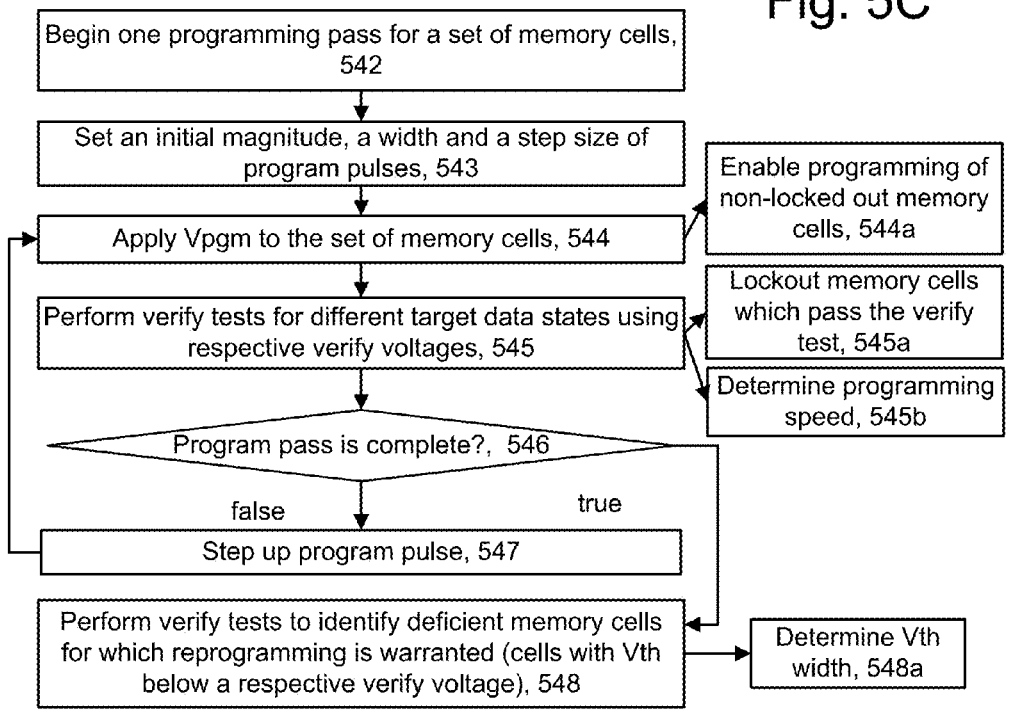
FIG. 5C depicts an example implementation of a programming pass consistent with steps 530 and 531 in FIG. 5B.

FIG. 5C depicts an example implementation of a programming pass consistent with steps 530 and 531 in FIG. 5B. Step 542 begins one programming pass for a set of memory cells comprising different subsets of memory cells with different target data states. Optionally, one or more previous programming passes have been performed. Step 543 sets an initial magnitude, a width and a step size of program pulses which are to be used in the programming pass. In one approach, the width and step size are fixed during the programming pass. Step 544 involves applying Vpgm (a program pulse) to the set of memory cells, such as via a selected word line. At the same time, step 544a enables programming of the memory cells which are not locked out, and prohibits programming of memory cells which are locked out. Enabling programming can involve setting a bit line voltage to 0 V or other low level, while prohibiting programming can involve setting a bit line voltage to a relatively high level. The locked out memory cells can include memory cells in the erased state and memory cells with a target data state (e.g., A, B or C) which have completed reprogramming by passing a verify test or which are not being reprogrammed. The non-locked out memory cells can include memory cells with a target data state (e.g., A, B or C) which have not completed reprogramming by passing a verify test.

Step 545 performs verify tests for the different target data states using respective verify voltages (e.g., VvA, VvB and VvC for the A, B and C state memory cells, respectively). For example, sensing circuitry which is connected to the bit lines can be used to sense a conductive or non-conductive state of the memory cells when a control gate voltage of VvA, VvB or VvC is applied to the word line. A cell which is in a non-conductive state has passed a verify test and is provided in a lockout state. Based on a result of the verify test as determined by the sensing circuitry, step 545a sets a lockout status for the memory cells which pass their respective verify test. Step 545b may also be used to determine a programming speed of the memory cells for each target data state, or an overall programming speed across all target data states, as discussed further below (e.g., FIG. 11C). Decision step 546 determines whether the programming pass is complete. This can occur when all, or a specified number of the memory cells have passed the verify test of their respective target data state, for instance. In other words, the one programming pass is complete when no more than a small number of memory cells fail their respective verify test. For example, 1-5% of the A, B and C state memory cells may fail their verify test. This amount may be based on an error correction capability of the memory device.

If decision step 546 is true, step 548 performs verify tests to identify deficient memory cells for which reprogramming is warranted, e.g., by detecting memory cells for which the Vth is below a respective verify voltage. This is the detrapping evaluation process. A first category of deficient memory cells includes memory cells which previously passed the verify test with a Vth above the verify voltage, where the Vth subsequently fell below the verify voltage due to significant detrapping. A second category of deficient memory cells may include a small number of memory cells which did not pass the verify test during the programming pass. Both categories of memory cells can be reprogrammed.

The verify voltage used to detect detrapping can be the same as the verify voltage used during programming in the programming pass, in one approach. Or, the verify voltage used to detect detrapping can be different than the verify voltage used in the programming pass. A result of the verify tests of step 548 can be stored in latches associated with the memory cell so that the deficient memory cells can be identified and programmed in a reprogramming pass. See, e.g., FIG. 18A-18D. If decision step 546 is false, the program pulse magnitude is stepped up by the step size at step 547 and Vpgm is again applied at step 544.

Optionally, step 548a can be performed to determine a Vth width for one or more data states. This can involve one or more additional sensing operations.

Figure 5D:
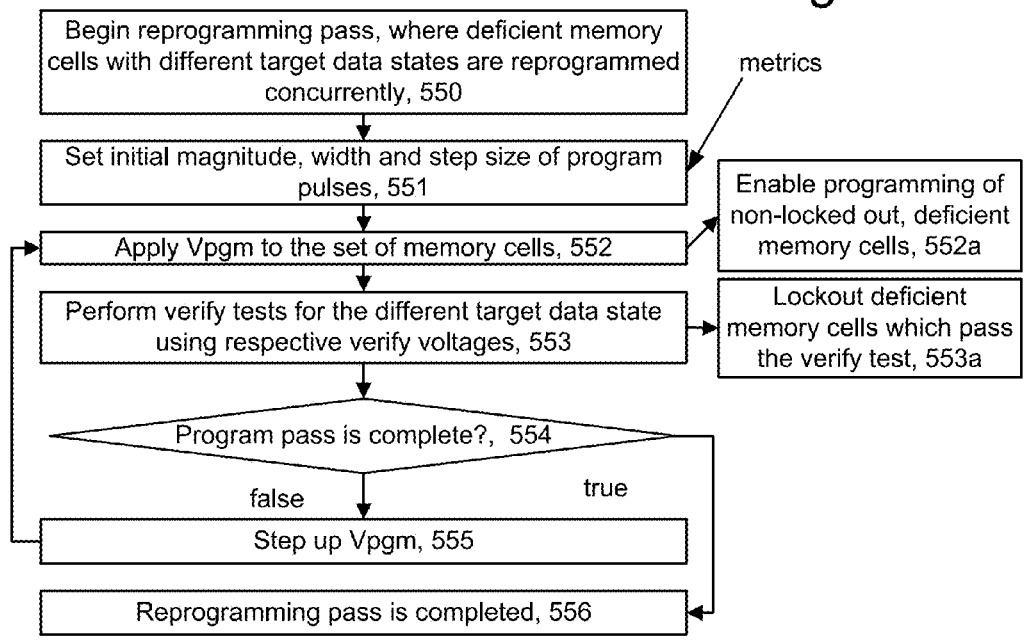
FIG. 5D depicts an example implementation of reprogramming consistent with steps 532 and 532a in FIG. 5B, where memory cells with different target data states are reprogrammed concurrently.

FIG. 5D depicts an example implementation of reprogramming consistent with steps 532 and 532a in FIG. 5B, where memory cells with different target data states are reprogrammed concurrently. Step 550 begins a reprogramming pass where deficient memory cells with different target data states are programmed concurrently. Step 551 sets an initial magnitude, width and step size of program pulses. Step 551 can be responsive to metrics such as a programming speed and a number of cells being reprogrammed. See, e.g., FIG. 17A to 17D.

Step 552 involves applying Vpgm to the set of memory cells such as via a selected word line. At the same time, step 552a enables programming of the non-locked out, deficient memory cells, and prohibits programming of other memory cells. The non-locked out, deficient memory cells can include deficient memory cells with a target data state (e.g., A, B or C) which have not completed reprogramming by passing a verify test in the reprogramming pass. Step 553 performs verify tests for the different target data states using respective verify voltages.

The respective verify voltages in the reprogramming can be the same as, or different than, the respective verify voltages in the prior programming pass. A goal of the reprogramming is to raise the Vth of the memory cells which have experienced detrapping. In one approach, the respective verify voltages in the reprogramming are higher than the respective verify voltages in the prior programming pass to compensate for potential further detrapping which may occur. For example, see voltages VvA1, VvB1 and VvC1 which are higher than VvA, VvB and VvC, respectively, in FIG. 10A. See also FIG. 12A.

In another approach, the respective verify voltages in the reprogramming are lower than the respective verify voltages in the prior programming pass, and may be similar to the read voltages, based on a theory that further detrapping is not a concern, in which case it is sufficient to ensure that the memory cells have a Vth above the read level which distinguishes their data state from the next lower data state (e.g., above VrC for a C state cell). In another approach, for a given deficient memory cell with a given target data state, a respective verify voltage in the reprogramming is between the respective verify voltage of the target data state in the one programming pass and above the read voltage which distinguishes the target data state from the next lower data state (e.g., between VrC and VvC for a C state cell).

Based on a result of the verify test as determined by sensing circuitry, step 553a sets a lockout status for the deficient memory cells which pass their respective verify test. Decision step 554 determines whether the programming pass is complete. This can occur when all, or at least a specified number, of the deficient memory cells have passed the verify test of their respective target data state, for instance. In other words, none, or no more than a specified number, of the deficient memory cells have not passed the verify test of their respective target data state. The criterion for completion can be different in steps 546 and 556, e.g., in terms of the percentage of cells which are required to pass a verify test. If decision step 554 is true, the reprogramming is complete at step 556. If decision step 554 is false, the program pulse magnitude is stepped up by the step size at step 555 and Vpgm is again applied at step 552. In one approach, the program pulse has a longer width compared to the one programming pass, so that the reprogramming should complete in fewer programming loops than the one programming pass. Optionally, a maximum allowable number of program loops (program-verify iterations or program pulses) can be less in the reprogramming than the prior programming pass.

FIG. 5E depicts an example implementation of reprogramming consistent with steps 532 and 532a in FIG. 5B, where deficient memory cells with different target data states are programmed separately, e.g., in different set of program-verify iterations (step 560). Step 561 selects a target data state to reprogram, e.g., the A state. Step 562 initializes the magnitude, width and step size of the program pulses for the target data state. These values are optimized for the current data state (e.g., the A state). Step 562 can be responsive to metrics such as a programming speed, Vth width and a number of cells being reprogrammed. See, e.g., FIG. 17A to 17D. Step 562 sets optimal parameters for ISPP of the deficient memory cells of a target data state.

Step 563 involves applying Vpgm to the set of memory cells. At the same time, step 563a enables programming of the non-locked, deficient memory cells of the selected target data state, and prohibits programming of other memory cells. The non-locked out deficient memory cells can include deficient memory cells of the A state which have not completed reprogramming by passing a verify test in the reprogramming.

Step 563b provides an option to enable programming for one additional program pulse without verify for a memory cell of a previously selected target data state which did not pass a verify test. That is, a memory cell being reprogrammed which does not pass its verify test before a next target data state is reprogrammed can have one more chance to be programmed. For example, the A state cells may meet the completion criterion in that, e.g., more than 95% of the A state cells being reprogrammed have passed the A state verify test. However, 5% or less of the A state cells being reprogrammed have not passed the A state verify test. These failed cells can continue to be programmed with one more program pulse during the B state reprogramming. This programming can be without verify of the A state, to avoid any additional time used for sensing.

In one approach, the first program pulse used when the B state is the selected data state is used to program the failed A state cells, and the first program pulse used when the C state is the selected data state is used to program the failed B state cells. However, other options are possible. For example, the second program pulse used when the B state is the selected data state can be used to program the failed A state cells. One of the program pulses used for reprogramming the B state can be selected which is optimal for the last chance programming of the deficient A state cells. See, e.g., FIG. 12C for further details. This approach can result in more complete reprogramming while keeping the reprogramming time at a minimum, e.g., by enforcing a maximum allowable number of program verify iterations in the reprogramming of each target data state.

In another option, when the last allowable program pulse for a target data state has been applied, a following verify test can be omitted. See, e.g., FIG. 12C for further details.

Step 564 performs a verify test for the selected target data state using a respective verify voltage. The verify test is for the non-locked out deficient memory cells of the selected target data state. The respective verify voltage in the reprogramming can be the same as, or different than, the respective verify voltages in the prior programming pass, for the selected target data state. Moreover, differences between the respective verify voltages in the reprogramming and the prior programming pass can be different for the different target data states.

Based on a result of the verify test as determined by sensing circuitry, step 564a sets a lockout status for the deficient memory cells which pass the verify test. Decision step 565 determines whether the verify test is passed for the target data state. This can occur, e.g., when all, or at least specified number of the deficient memory cells have passed the verify test of the target data state, for instance. The criterion for completion can be different for the different data states, e.g., in terms of the percentage of cells which are required to pass a verify test. If decision step 565 is true, a decision step 568 determines if there is a next target data state to reprogram. If decision step 568 is false, the reprogramming pass is completed at step 569. If decision step 568 is true, a next target data state, e.g., the B state, is selected to be reprogrammed at step 561. If decision step 565 is false, a decision step 566 determines if a maximum allowable number of program loops have been performed for the target data state. The maximum allowable number of program loops can be the same or different for the different target data states. If decision step 566 is false, the program pulse magnitude is stepped up by the step size at step 567 and Vpgm is again applied at step 563. That is, the reprogramming for the selected target data state continues. If decision step 566 is true, decision step 568 is reached.

Figure 5F:
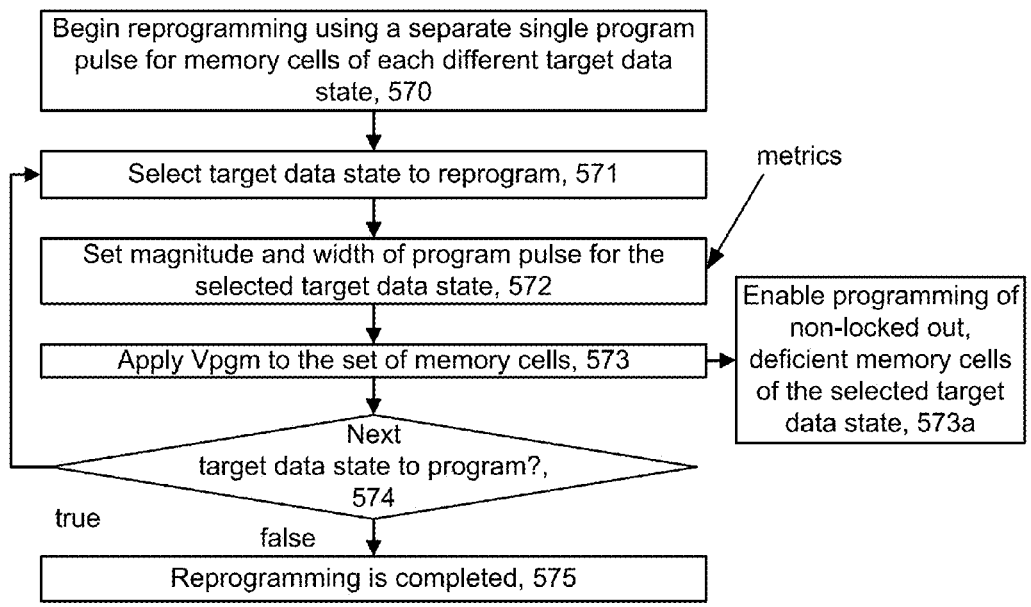
FIG. 5F depicts an example implementation of reprogramming using one program pulse per target data state, consistent with steps 533 and 533a in FIG. 5B.

FIG. 5F depicts an example implementation of reprogramming using one program pulse per target data state, consistent with steps 533 and 533a in FIG. 5B. Step 570 begins a reprogramming using a separate single program pulse for each different target data state. Step 571 selects a target data state to reprogram, e.g., the A state. Step 572 sets a magnitude and width (duration) of the program pulse for the target data state. These values are optimized for the A state. Step 572 can be responsive to metrics such as a programming speed and a number of cells being reprogrammed. Step 572 sets optimal parameters for one-pulse per data state reprogramming of the deficient memory cells of a target data state. Step 573 involves applying Vpgm to the set of memory cells. At the same time, step 573a enables programming of the non-locked, deficient memory cells of the selected target data state, and prohibits programming of other memory cells. The non-locked out deficient memory cells can include memory cells with the A state. A decision step 574 determines if there is a next target data state to reprogram. If decision step 574 is false, the reprogramming is completed at step 575. If decision step 574 is true, a next target data state, e.g., the B state, is selected to be reprogrammed at step 571.

In FIG. 5D to 5F, one or more widths of the program pulses applied to the set of memory cells during the program-verify iterations in the reprogramming pass are set to minimize a width of a threshold voltage distribution for each respective target data state.

Figure 6A:
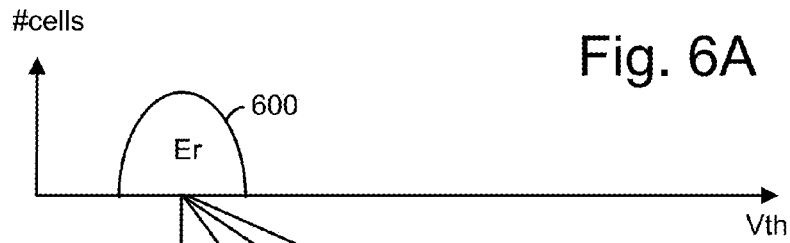
FIGS. 6A and 6B depict a one-pass programming operation with four data states as an example of the programming pass of FIG. 5C.
Figure 6B:
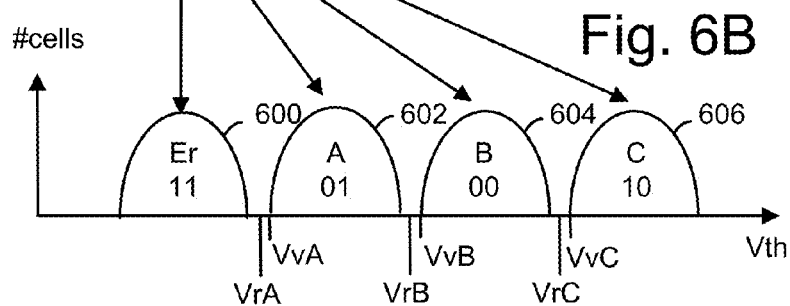

FIGS. 6A and 6B depict a one-pass programming operation with four data states as an example of the programming pass of FIG. 5C. A one programming pass operation involves (only) one sequence of multiple program-verify operations which are performed starting from an initial Vpgm level and proceeding to a final Vpgm level until the threshold voltages of a set of selected memory cells reach one or more respective verify voltages of respective target data states. All memory cells may initially be in an erased state at the beginning of a programming pass.

Example Vth distributions for the memory cell array are provided for a case where each memory cell stores two bits of data. Each graph depicts Vth on the horizontal axis and a number or population of memory cells in a Vth distribution, using a logarithmic scale, on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A bit combination is stored in a set of latches such as in FIG. 1C. For example, the LP bit can be stored in LDL and the UP bit can be stored in UDL.

A first Vth distribution 600 is provided for erased (Er) state memory cells. Three Vth distributions 602, 604 and 606 represent target data states A, B and C, respectively, which are reached by memory cells when their Vth exceeds the verify voltage VvA, VvB or VvC, respectively. In this case, each memory cell can store two bits of data in one of four possible Vth ranges.

After the programming pass is completed, the data can be read from the memory cells using read reference voltages VrA, VrB and VrC which are between the Vth distributions. By testing whether the Vth of a given memory cell is above or below one or more of the read reference voltages, the system can determine the data state which is represented by a memory cell. As mentioned, a reprogramming can reduce the number of read errors caused by detrapping.

Figure 7A:
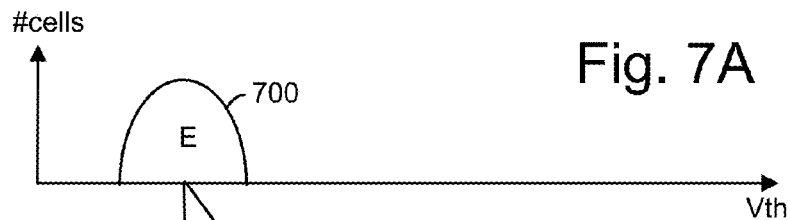
FIGS. 7A to 7C depict a two-pass programming operation with four data states as another example of the programming pass of FIG. 5C.
Figure 7B:
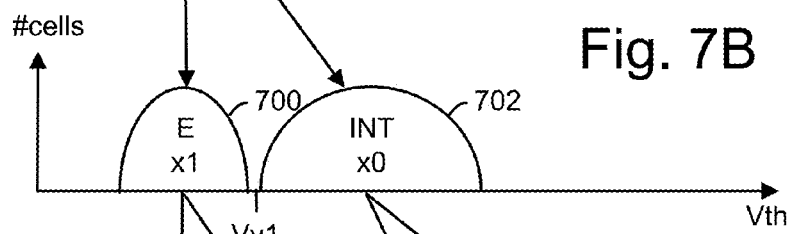
Figure 7C:
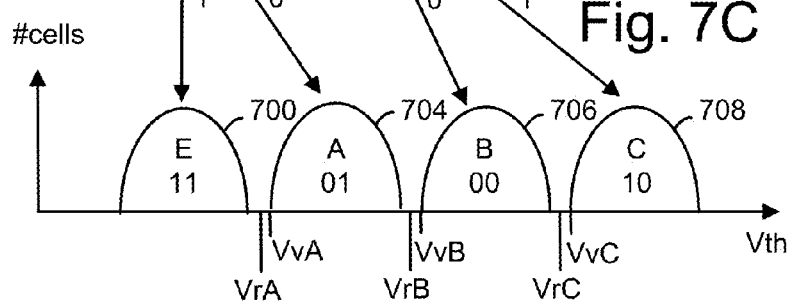

FIGS. 7A to 7C depict a two-pass programming operation with four data states as another example of the programming pass of FIG. 5C. The programming pass of FIG. 5C can be used on one or both of these programming passes. Each programming pass can be used to program a page of data. Programming can be performed one logical page at a time, with the lower page followed by the upper page.

FIG. 7A depicts a Vth distribution of memory cells at a start of the programming operation. Initially, all memory cells are in the Er state, represented by the distribution 700.

FIG. 7B depicts a Vth distribution of memory cells after programming of a lower page of data in a first programming pass. If the lower page has a bit=1, the associated memory cell remains in the distribution 700 and the data is represented by x1, where x is an upper page bit that is not yet known. If the lower page has a bit=0, the memory cell is programmed to a higher Vth as represented by distribution 702, which is an interim distribution (INT), using a verify voltage Vv1. The data of these memory cells is represented by x0. The interim distribution can be relatively wide since it is not a final distribution and does not represent a final data state.

FIG. 7C depicts a Vth distribution of memory cells after programming of an upper page of data in a second programming pass. If UP/LP=11, the associated memory cell in the distribution 700 remains in the distribution 700 and stores data bits 11. If UP/LP=01, the memory cells in the distribution 700 are programmed to the A state distribution 704 using VvA. If UP/LP=00, the memory cells in the distribution 702 are programmed to the B state distribution 706 using VvB. If UP/LP=10, the memory cells in the distribution 702 are programmed to the C state distribution 708 using VvC. Programming can be similarly extended to three or more bits per memory cell.

Figure 8A:
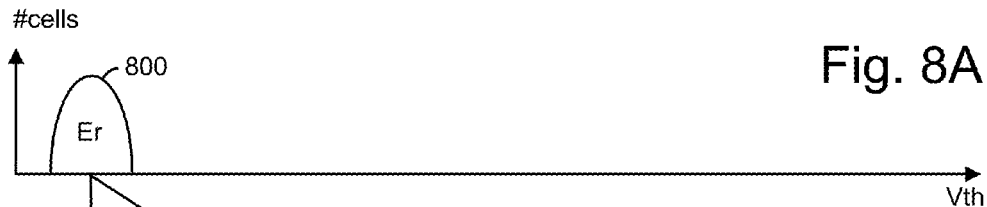
FIGS. 8A to 8C depict a three-pass programming operation with eight data states as another example of the programming pass of FIG. 5C.
Figure 8B:
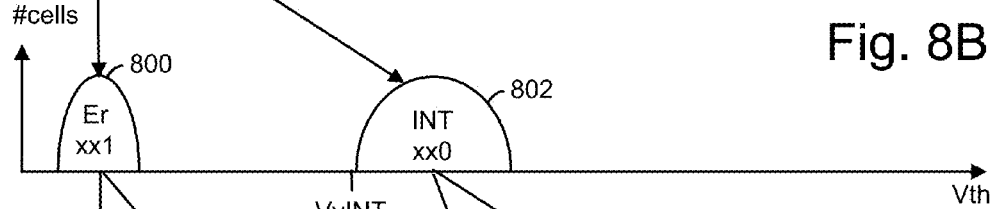
Figure 8C:
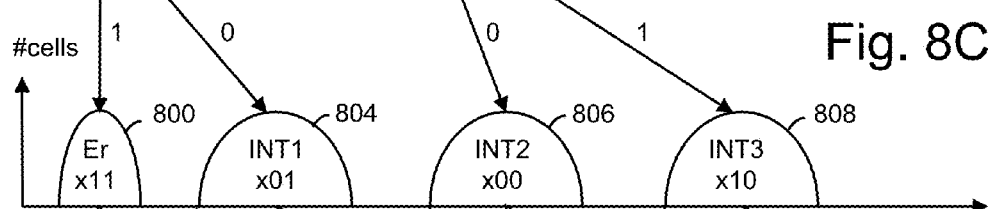

FIGS. 8A to 8C depict a three-pass programming operation with eight data states as another example of the programming pass of FIG. 5C.

FIG. 8A depicts a starting threshold distribution of an example three-pass programming operation with eight data states. Initially, the cells are all in the erased (Er) state as represented by the threshold distribution (Vth) distribution 800. The vertical axis indicates the number of cells and the horizontal axis indicates a Vth.

FIG. 8B depicts a threshold distribution which results after a first pass of the example three-pass programming operation of FIG. 8A. Based on write data as indicated, the cells which are to remain in the Er state, or programmed to the A, B and C states, are represented by the Vth distribution 800, while the cells which are to be programmed to the D, E, F and G states are programmed to an intermediate (INT) distribution 802. This programming pass may be referred to as an first intermediate pass in which a verify voltage of VvINT is used.

FIG. 8C depicts a threshold distribution which results after a second pass of the example three-pass programming operation of FIG. 8A. Based on write data as indicated, the cells which are to remain in the Er state, or programmed to the A state, are represented by the Vth distribution 800. The cells which are to be programmed to the B and C states are programmed to a first intermediate (INT1) distribution 804. The cells which are to be programmed to the D and E states are programmed to a second intermediate (INT2) distribution 806. The cells which are to be programmed to the F and G states are programmed to a third intermediate (INT3) distribution 808. This programming pass may be referred to as a second intermediate pass in which verify voltages of VvINT1, VvINT2 and VvINT3 are used.

Figure 8D:
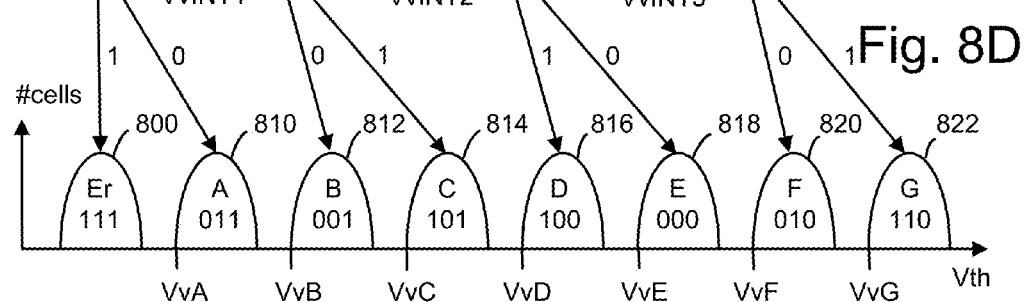
FIG. 8D depicts a threshold distribution which results after a third pass of the example three-pass programming operation of FIG. 8A.

FIG. 8D depicts a threshold distribution which results after a third pass of the example three-pass programming operation of FIG. 8A. Based on the write data as indicated, the cells which are to remain in the Er state are represented by the Vth distribution 800, while the cells which are to be programmed to the A, B, C, D, E, F and G states are represented by the Vth distributions 810, 812, 814, 816, 818, 820 and 822, respectively. This programming pass uses verify voltages of VvA, VvB, VvC, VvD, VvE, VvF and VvG. Each data state represents three bits of data as indicated.

Figure 9A:
FIGS. 9A and 9B depict a one-pass programming operation with eight data states as another example of the programming pass of FIG. 5C.

FIG. 9A depicts a starting threshold distribution of an example one-pass programming operation with eight data states. A Vth distribution 900 represents the Er state.

Figure 9B:
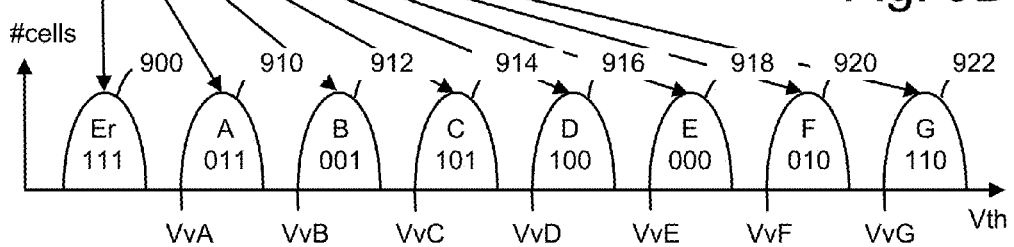

FIG. 9B depicts a final threshold distribution of the one-pass programming operation of FIG. 9A. The A, B, C, D, E, F and G states are represented by the Vth distributions 910, 912, 914, 916, 918, 920 and 922, respectively.

Figure 10A:
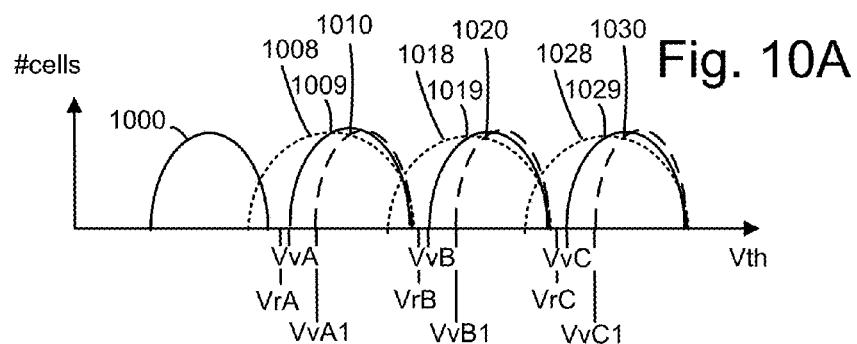
FIG. 10A depicts changes in a threshold voltage distribution due to de-trapping and subsequent reprogramming, in a memory device with four data states.

FIG. 10A depicts a threshold voltage distribution showing a downshift in Vth due to detrapping and an upshift in Vth due to reprogramming. As mentioned, detrapping results in a downshift in the Vth of a memory cell. For example, after one programming pass, the Vth distributions 1000, 1009, 1019 and 1029 represent the Er, A, B and C states, respectively, in a theoretical situation in which there is no detrapping. The Vth distributions 1008, 1018 and 1028 represent the A, B and C states, respectively, in an actual distribution which occurs due to detrapping. The lower tail of the Vth distributions is downshifted. With reprogramming, the lower tails of the Vth distributions 1008, 1018 and 1028 are pushed up to provide the Vth distributions 1010, 1020 and 1030, respectively. In practice, some further detrapping can occur, resulting in the distributions 1009, 1019 and 1029. In this example, the reprogramming uses verify voltage VvA1, VvB1 and VvC1 which are higher than VvA, VvB and VvC, respectively, from the one programming pass.

Figure 10B:
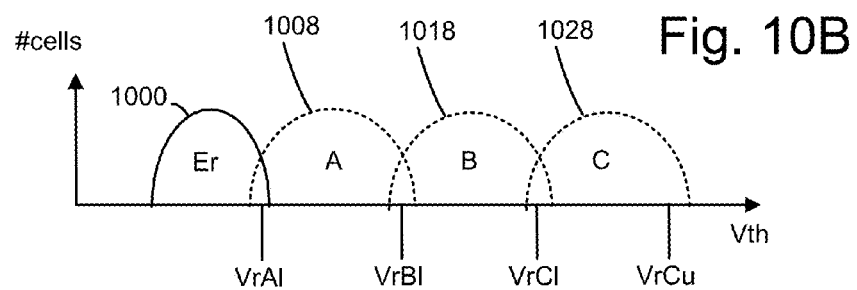
FIG. 10B depicts verify voltages used to determine widths of the Vth distributions of the target data states.

FIG. 10B depicts verify voltages used to determine widths of the Vth distributions of the target data states. As mentioned in connection with step 548a of FIG. 5C, in connection with the detrapping evaluation process, one or more additional sensing operations can be performed to determine a Vth width for one or more data states. The width of a Vth distribution and in particular the extent of the lower tail can be useful in setting the programming pulse width, initial magnitude or step size in the reprogramming. In one approach which minimizes a number of additional sensing operations, sensing results from one read voltage can be used to determine the lower extent of one data state and an upper extent of the next lower data state. For example, a read voltage of VrB1 can be used to determine the lower extent of the B state and an upper extent of the A state, and a read voltage of VrC1 can be used to determine the lower extent of the C state and an upper extent of the B state. Additional read voltages are VrA1 which determines the lower extent of the A state and VrCu which determines the upper extent of the C state. Additional read voltages may be used as well to determine the Vth widths.

A measure of the width of a Vth distribution can be determined by the control based on the number of cells which have a Vth below the lower extent read voltage and above the upper extent read voltage. When relatively more cells have a Vth below the lower extent read voltage and/or above the upper extent read voltage, the Vth is relatively wider. Testing of memory devices at the time of manufacture can determine an average number of cells which have a Vth below the lower extent read voltage and above the upper extent read voltage, and these numbers can be programmed into the control of the memory device. During a programming operation, the number of cells which have a Vth below the lower extent read voltage and/or above the upper extent read voltage can be compared to the average values to obtain a gauge of the Vth distribution. Optionally, the read at VrCu can be omitted since the lower tail may be more variable than the upper tail due to detrapping. When the Vth distribution width is relatively wider, a relatively stronger reprogramming may be used to ensure that the cells with the lowest Vth are pushed up sufficiently to narrow the Vth distribution. For example, a relatively wider program pulse and/or higher magnitude pulse may be used.

The process thus involves, after the completion of the one programming pass, obtaining a measure of a width of a threshold voltage distribution of at least one of the target data states, wherein for the at least one of the target data states, the width of the program pulse applied to the set of memory cells during the program-verify iterations in the reprogramming pass is relatively wider when the measure of the width of the threshold voltage distribution is relative greater. The process further involves, after the completion of the one programming pass, for each respective subset of memory cells: determining a width of a respective threshold voltage distribution, and setting a magnitude of each respective single program pulse as a function of the respective threshold voltage distribution, wherein the magnitude is relatively higher when the respective threshold voltage distribution is relatively wider.

Figure 11A:
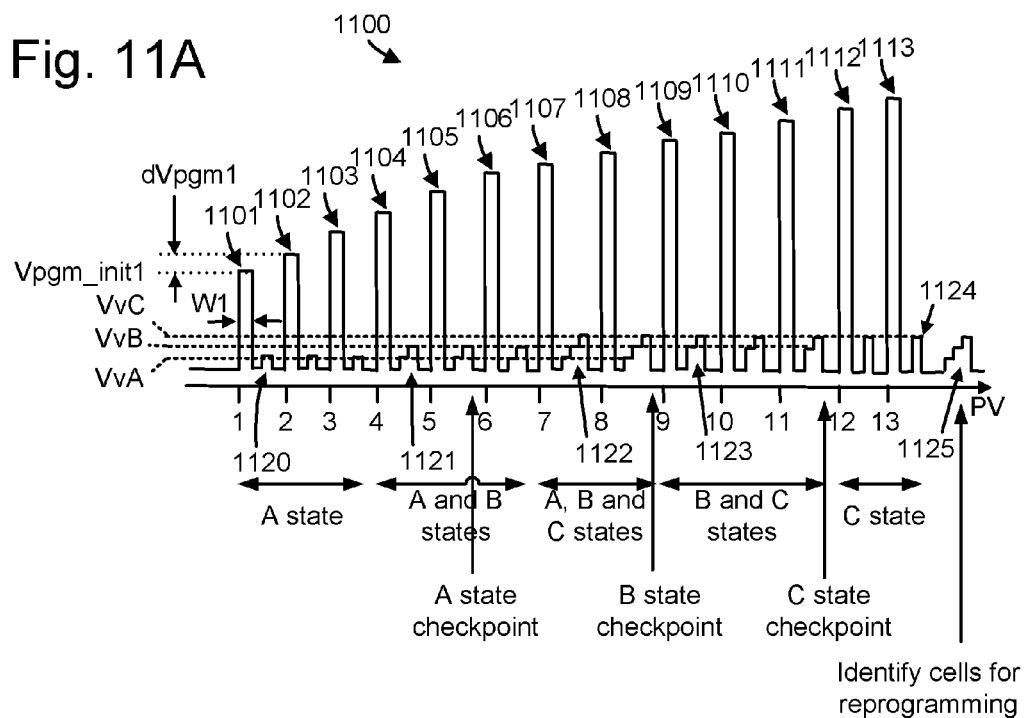
FIG. 11A depicts a series of program-verify iterations in an example of the one-pass programming of FIG. 5C.

FIG. 11A depicts a series of program-verify iterations in an example of the one-pass programming of FIG. 5C. The horizontal axis depicts a program-verify iteration number (PV) and the vertical axis depicts a control gate or word line voltage of a set of memory cells. The pulse train 1100, or staircase of program pulses, includes a series of program pulses 1101-1113 that are applied to a word line selected for programming. In a staircase of program pulses, Vpgm_init1 is the initial magnitude of a program pulse, W1 is a width of the program pulses and dVpgm1 is a step size.

This programming pass performs a reduced number of verify tests based on the fact that the memory cells with the lower target data states will generally complete programming before the memory cells with the higher target data states. There will be some overlap such that some memory cells with different target data states complete programming in the same program-verify iteration. Thus, for a given target data state, some memory cells will complete programming at a lower program loop and other memory cells will complete programming at a higher program loop.

One, two or three verify pulses are provided after each program pulse as an example, based on the target data states which are being verified. For example, a verify voltage 1120 of magnitude VvA is applied in PV1-PV3 to verify A state cells, a set of verify voltages 1121 with magnitudes VvA and VvB is applied in PV4-PV6 to verify A and B state cells, respectively, a set of verify voltages 1122 with magnitudes VvA, VvB and VvC is applied in PV7 and PV8 to verify A, B and C state cells, respectively, a set of verify voltages 1123 with magnitudes VvB and VvC is applied in PV9-PV11 to verify B and C state cells, respectively, and a verify voltage 1124 with a magnitude VvC is applied in PV12 and PV13 to verify C state cells. Further, a set of verify voltages 1125 is used to identify cells for reprogramming after completion of the programming pass in PV13.

A verify test is performed using each verify pulse to determine whether a cell has a Vth above or below the verify voltage. In a verify test, a sensing operation is performed for cells along a word line. A current in each NAND string is compared to a reference current at a sense time. If the current exceeds a reference current, the cell in the NAND string is considered to be in a conductive state and the Vth is below the verify voltage (the verify test is failed). If the current is less than the reference current, the cell in the NAND string is considered to be in a non-conductive state and the Vth is above the verify voltage (the verify test is passed). When a cell is sensed and subject to a verify test, data latches can be updated based on a result of the verify test.

Figure 11B:
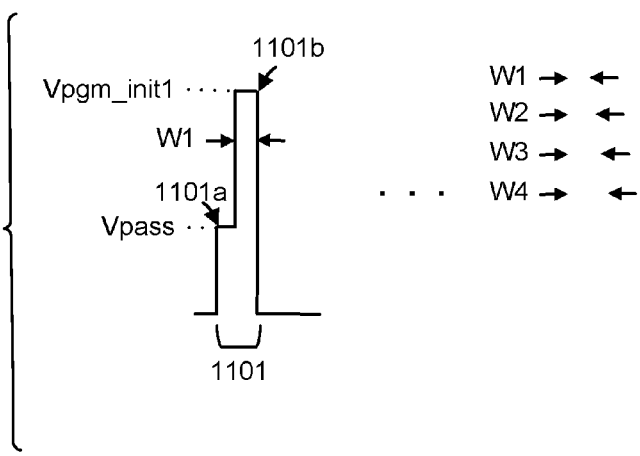
FIG. 11B depicts an example of the program voltage waveform 1101 in FIG. 11A.

FIG. 11B depicts an example of the program voltage waveform 1100 in FIG. 11A. In practice, each program pulse can have an initial portion 1101a of a lower magnitude Vpass, e.g., 6-8 V, and a peak portion of 1101b of a higher magnitude (e.g., Vpgm_init1, 15-25 V). The width W1 of the program pulse may refer to a width of the peak portion, in one approach. The lower portion generally has a significantly lower magnitude than the second portion and thus has little or no programming effect on the selected memory cells. Stepping the voltage up in two steps helps avoid a large and sudden voltage change which can disturb neighboring memory cells. Moreover, the peak portion of the program pulse typically has a uniform magnitude but other options are possible, such as a ramped, stepped or saw tooth shaped magnitude.

Figure 11C:
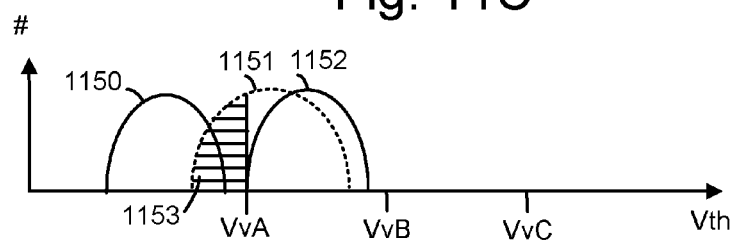
FIG. 11C depicts an example of detecting a programming speed, consistent with step 545b of FIG. 5C.

FIG. 11C depicts an example of detecting a programming speed, consistent with step 545b of FIG. 5C. The initial Vth distribution 1150 represents the erased state. In one example, referring to FIG. 11A, assume the Vth distribution 1151 is reached in PV5 after the program pulse 1105. The Vth distribution 1152 is reached in PV8 after the program pulse 1108. PV5 can provide a checkpoint for determining the programming speed of the A state memory cells. In PV5, the number of A state memory cells which have a Vth which is below VvA is represented by a shaded area 1153 of the distribution 1151. These are the A state memory cells which have not passed their verify test. If this number is relatively small, the programming speed of the A state cells is relatively high. Similarly, if this number is relatively high, the programming speed of the A state cells is relatively low. A baseline number can represent an average speed. Checkpoints can also be provided for the B and C states in PV8 and PV11, respectively, for example, to determine the programming speeds for the B and C states. An overall programming speed across all target data states can be determined based on an average, median or other value derived from the programming speeds of each target data state.

Figure 12A:
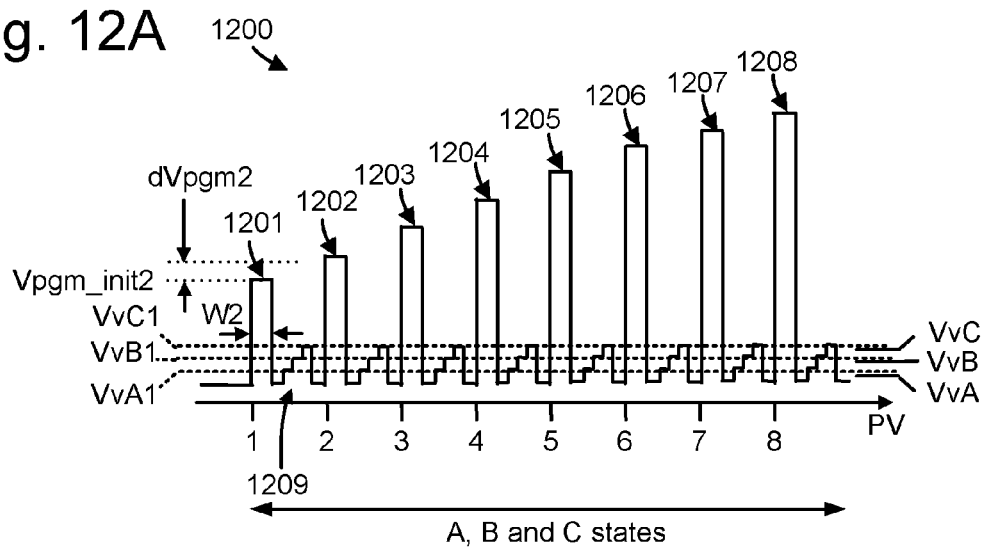
FIG. 12A depicts a series of program-verify iterations in a reprogramming pass, where memory cells with different target data states are reprogrammed concurrently, consistent with FIG. 5D.

FIG. 12A depicts a series of program-verify iterations in a reprogramming pass, where memory cells with different target data states are reprogrammed concurrently, consistent with FIG. 5D. The horizontal axis depicts a program-verify iteration number (PV) and the vertical axis depicts a control gate or word line voltage. The pulse train 1200 comprises a set of program-verify iterations which includes a staircase progression of program pulses 1201-1208 that are applied to a word line selected for programming in PV1-PV8, respectively. In a staircase of program pulses, Vpgm_init2 is the initial magnitude of a program pulse, W2 is a width of the program pulses and dVpgm2 is a step size. As mentioned, these values are optimized for a reprogramming which has fewer program-verify iterations than the one programming pass of FIG. 11A. A goal of the reprogramming is to quickly reverse the downshift in Vth caused by detrapping without performing a full programming pass. To achieve this, the program pulse width can be increased relative to the one programming pass. The width is optimized to move the lower tail of the Vth distribution higher in one or a few (e.g., 2 or 3) program-verify iterations. Further, the initial magnitude can differ compared to the one programming pass. In one approach, a lower initial magnitude is used such that Vpgm_init2<Vpgm_init1. Further, the step size can differ compared to the one programming pass.

In this example, a set of three verify pulses (1209) are provided after each program pulse. For example, verify voltages of VvA1, VvB1 and VvC1 are applied in PV1-PV8 to verify A, B and C state cells, respectively.

Figure 12B:
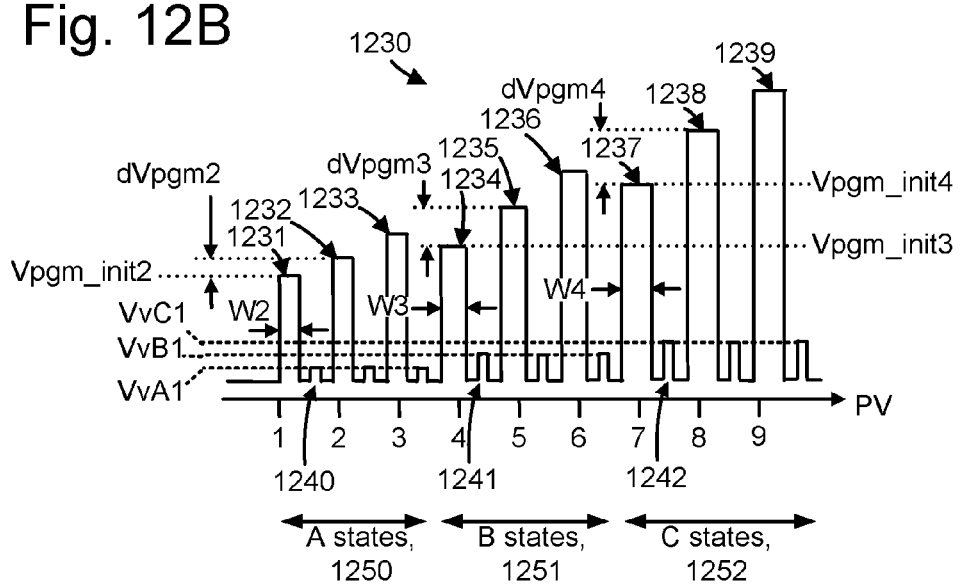
FIG. 12B depicts a series of program-verify iterations in a reprogramming pass, where memory cells with different target data states are reprogrammed separately, consistent with FIG. 5E.

FIG. 12B depicts a series of program-verify iterations in a reprogramming pass, where memory cells with different target data states are reprogrammed separately, consistent with FIG. 5E. The horizontal axis depicts a program-verify iteration number (PV) and the vertical axis depicts a control gate or word line voltage. The pulse train 1230 comprises three separate sets of program-verify iterations 1250, 1251 and 1252 for reprogramming the deficient memory cells of the A, B and C states, respectively. Each set of program-verify iterations 1250, 1251 and 1252 comprises a respective different staircase progression of program pulses 1231-1233, 1234-1236 and 1237-1239, respectively, that is applied to a word line selected for programming in PV1-PV3, PV4-PV6 and PV7-PV9, respectively. In this example, three program-verify iterations is the maximum allowable number of program-verify iterations for reprogramming each target data state. Note that the drawings are not necessarily to scale, e.g., in terms of the program pulse widths. However, in one approach, W4>W3>W2>W1. See also FIG. 11B.

For the first staircase, Vpgm_init2 is the initial magnitude of a program pulse, W2 is a width of the program pulses and dVpgm2 is a step size. For the second staircase, Vpgm_init3 is the initial magnitude of a program pulse, W3 is a width of the program pulses and dVpgm3 is a step size. For the third staircase, Vpgm_init4 is the initial magnitude of a program pulse, W4 is a width of the program pulses and dVpgm4 is a step size. In one approach, W2<W3<W4 and dVpgm4>dVpgm3>dVpgm2. Also in this example, the staircase of program pulses 1234-1236 is inconsistent with the staircase of program pulses 1231-1233 since the magnitude of the first pulse of the staircase 1251, Vpgm_init3, at pulse 1234, is less than the magnitude of the last program pulse 1233 of the staircase 1250 plus the step size dVpgm2.

Similarly, the staircase of program pulses 1237-1239 is inconsistent with the staircase of program pulses 1234-1236 since the magnitude of the first pulse of the staircase 1252, Vpgm_init4, at pulse 1237, is less than the magnitude of the last program pulse 1236 of the staircase 1251 plus the step size dVpgm3.

Thus, at least one of the different staircase progressions of program pulses (1251, 1252) has an initial magnitude (Vpgm_init3, Vpgm_init4) which is not consistent with a staircase progression of program voltages of a prior one of the different staircase progressions of program voltages (1250, 1251).

Figure 12D:
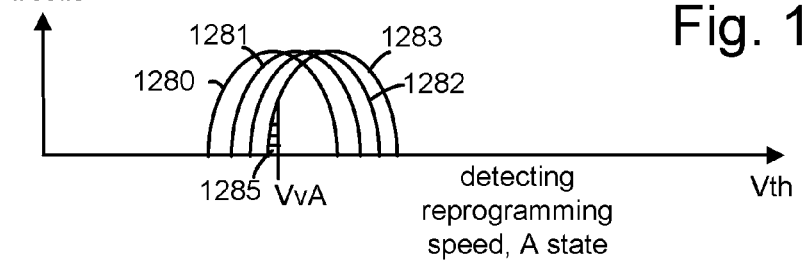
FIG. 12D depicts an example of detecting a programming speed in a reprogramming pass, consistent with step 564b of FIG. 5E.
Figure 12C:
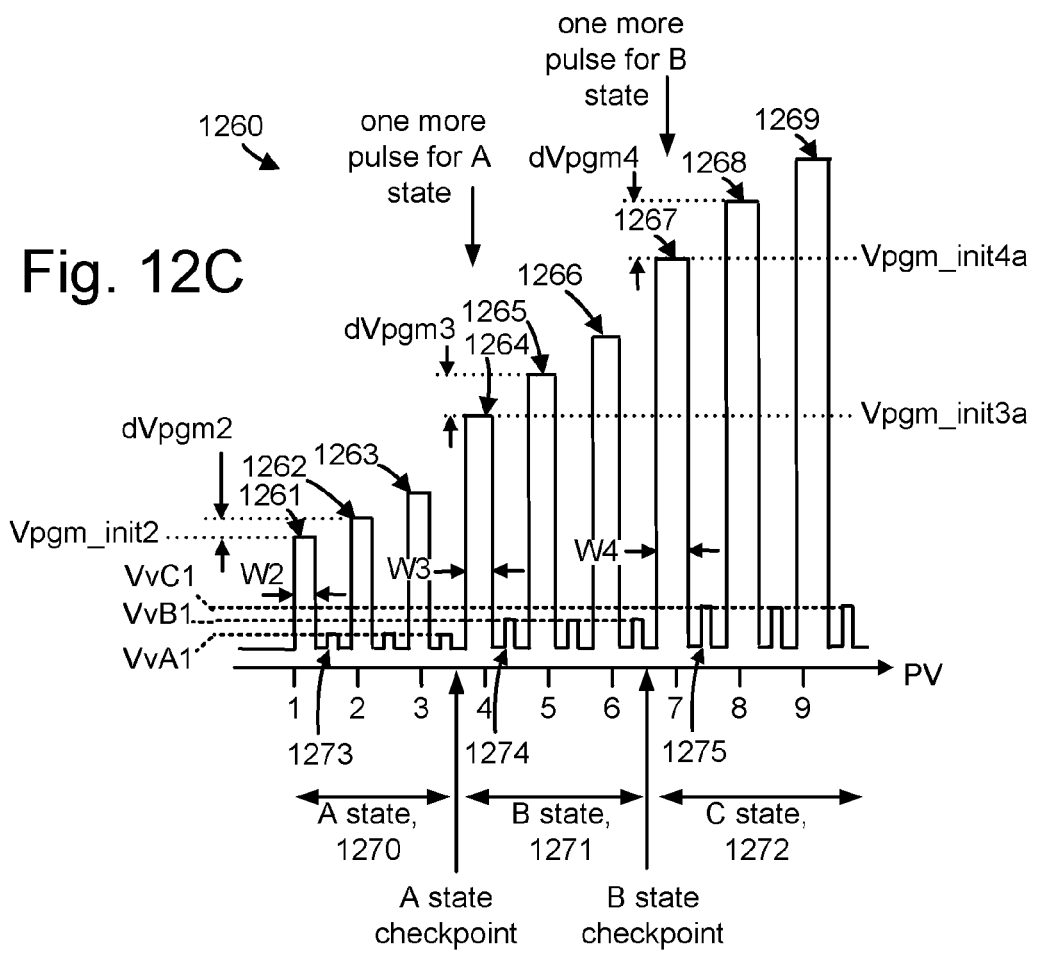
FIG. 12C depicts a series of program-verify iterations in another example of a reprogramming pass, where memory cells with different target data states are reprogrammed separately, consistent with FIG. 5E and as an alternative to FIG. 12B.

FIG. 12C depicts a series of program-verify iterations in another example of a reprogramming pass, where memory cells with different target data states are reprogrammed separately, consistent with FIG. 5E and as an alternative to FIG. 12B. This example differs from FIG. 12B in that the magnitude of the program pulses.

The horizontal axis depicts a program-verify iteration number (PV) and the vertical axis depicts a control gate or word line voltage. The pulse train 1260 comprises three sets of program-verify iterations 1270, 1271 and 1272 for reprogramming the deficient memory cells of the A, B and C states, respectively. Each set of program-verify iterations 1270,

1271 and 1272 comprises a respective staircase progression of program pulses 1261-1263, 1264-1266 and 1267-1269, respectively, that is applied to a word line selected for programming in PV1-PV3, PV4-PV6 and PV7-PV9, respectively. In this example, three program-verify iterations is the maximum allowable number of program-verify iterations for reprogramming each target data state.

For the first staircase, Vpgm_init2 is the initial magnitude of a program pulse, W2 is a width of the program pulses and dVpgm2 is a step size. For the second staircase, Vpgm_init3a is the initial magnitude of a program pulse, W3 is a width of the program pulses and dVpgm3 is a step size. For the third staircase, Vpgm_init4a is the initial magnitude of a program pulse, W4 is a width of the program pulses and dVpgm4 is a step size. In one approach, W2<W3<W4 and dVpgm4>dVpgm3>dVpgm2. Also in this example, the staircase of program pulses 1264-1266 is inconsistent with the staircase of program pulses 1261-1263 since the magnitude of the first pulse of the staircase 1264-1266, Vpgm_init3a, at pulse 1264, is greater than the magnitude of the last program pulse 1263 of the staircase 1261-1263 plus the step size dVpgm2.

Similarly, the staircase of program pulses 1267-1269 is inconsistent with the staircase of program pulses 1264-1266 since the magnitude of the first pulse of the staircase 1267-1269, Vpgm_init4a, at pulse 1267, is greater than the magnitude of the last program pulse 1266 of the staircase 1264-1266 plus the step size dVpgm3.

Verify voltages of VvA1, VvB1 and VvC1 are used in the first, second and third sets of program-verify iterations Additionally, checkpoints for determining the reprogramming speeds of the A and B state cells are provided in PV3 and PV6, respectively. See FIG. 12D.

FIG. 12C also shows an option to use one more pulse for A state cells (e.g., in PV4) and one more pulse for B state cells (e.g., in PV7) which have not passed their verify test during the reprogramming. A verify test is not used for the A state cell in PV4 or for the B state cell in PV7. A verify test is used for the A state cells in PV3 and the B state cells in PV6 to determine which A or B state cells, respectively, to be programmed with one more pulse. Programming a cell with one more pulse means enabling the cell to be programmed when the program pulse is applied, e.g., by grounding a voltage of a bit line connected to the cell.

In another option, when the last allowable program pulse for a target data state has been applied in the series of program-verify iterations which are dedicated to that target data state, a verify test can be omitted. For example, if PV3 is the last allowable program pulse for the A state (e.g., only three program pulses are allowed for programming each target data state), the A state verify test can be omitted in PV3 since the result of the verify test is not needed to determine which A state cells to continue programming. Subsequently, no further reprogramming is performed for the A state cells.

FIG. 12D depicts an example of detecting a programming speed in a reprogramming pass, consistent with step 564b of FIG. 5E. The Vth distribution 1280 represents the deficient A state memory cells at a start of the reprogramming and corresponds to the Vth distribution 1008 in FIG. 10A. The Vth distributions 1281, 1282 and 1283 represent the deficient A state memory cells after the program pulses 1231, 1232 and 1233, respectively. At the end of the first set of program-verify iterations 1250, in PV3, a region 1285 represents a number of deficient A state cells which have not passed the verify test. This number indicates a programming speed during the reprogramming pass, or a reprogramming speed. A higher number correlates to a lower programming speed. Although the programming parameters were optimized for reprogramming of the A state cells, some of the slower cells may not pass the verify test due to a limit on the number of program-verify iterations. Moreover, the programming parameters may be optimized for average A state cells, in which case some slower than average A state cells may not pass the verify test. Additionally, other factors such as random behavior, die to die variations, number of program-erase cycles and ambient temperature can affect performance. As a result, it can be useful to obtain a metric of reprogramming speed for the deficient cells during an initial portion of the reprogramming and use this metric to modify the subsequent reprogramming. The reprogramming speeds of other data states can be determined similarly.

For example, the reprogramming speed for the A state cells can be used to modify the subsequent reprogramming of the B and C state cells. If the programming speed is lower than expected, an initial magnitude, pulse width or step size can be increased for the B and C state cells to increase their programming speed. It is also possible to obtain the reprogramming speed of the deficient B state cells and use this to modify the reprogramming of the C state cells. Further, the reprogramming speeds of the A and B state cells can be combined to provide an average value which is used to adjust the reprogramming of the C state cells. This concept can be extended to additional target data states as well.

Figure 13A:
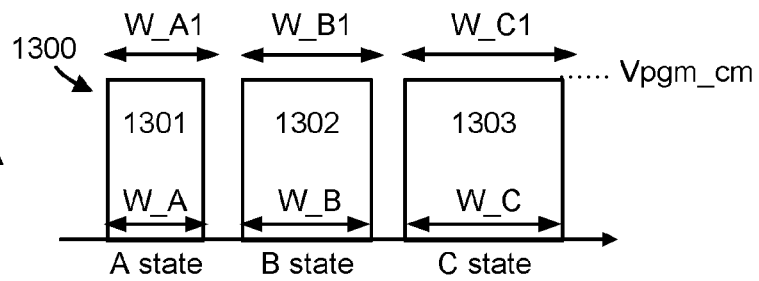
FIG. 13A depicts a series of program-verify iterations in another example of a reprogramming pass, where memory cells with different target data states are reprogrammed with a separate single program pulse, consistent with steps 533 and 533a of FIG. 5B and with FIG. 5F, and each program pulse has a common magnitude.

FIG. 13A depicts a series of program-verify iterations in another example of a reprogramming pass, where memory cells with different target data states are reprogrammed with a separate single program pulse, consistent with steps 533 and 533a of FIG. 5B and with FIG. 5F. A pulse train 1300 comprises first, second and third program pulses 1301, 1302 and 1303 with widths of W_A, W_B and W_C, respectively, for reprogramming the deficient memory cells of the A, B and C states, respectively, where W_A<W_B<W_C and each program pulse has a common magnitude of Vpgm_cm. No verify test is performed.

Figure 13B:
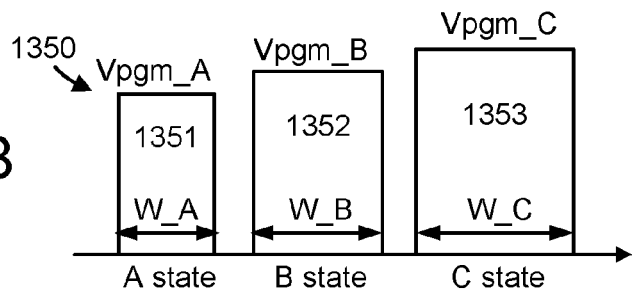
FIG. 13B depicts a series of program-verify iterations in another example of a reprogramming pass, where memory cells with different target data states are reprogrammed with a separate single program pulse, consistent with steps 533 and 533a of FIG. 5B and with FIG. 5F, and each program pulse has a different magnitude.

FIG. 13B depicts a series of program-verify iterations in another example of a reprogramming pass, where memory cells with different target data states are reprogrammed with a separate single program pulse, consistent with steps 533 and 533a of FIG. 5B and with FIG. 5F, and each program pulse has a different magnitude. A pulse train 1350 comprises first, second and third program pulses 1351, 1352 and 1353 with widths of PW_A, PW_B and PW_C, respectively, for reprogramming the deficient memory cells of the A, B and C states, respectively, where PW_A<PW_B<PW_C. Also, the program pulses have different magnitudes of Vpgm_A, Vpgm_B and Vpgm_C for the A, B and C states, respectively. No verify test is performed.

Note that when there are several target data states to be reprogrammed, cells with neighboring data states can be programmed together. For example, with target data states of A, B, C, D, E, F and G, the A and B states can be programmed by a common program pulse, the C and D states can be programmed by another common program pulse, and so forth.

FIG. 14A to 14F depict Vth distributions after one programming pass (Vth distributions 1400, 1410, 1420, 1430, 1440 and 1450 in FIGS. 14A, 14B, 14C, 14D, 14E and 14F, respectively) and after a one-pulse reprogram (Vth distributions 1401, 1411, 1421, 1431, 1441 and 1451 in FIGS. 14A, 14B, 14C, 14D, 14E and 14F, respectively), for different program pulse magnitudes. The Vth distributions are for the B state, as an example. The program pulse width for reprogramming is the same in each figure. The program pulse has a lowest magnitude in FIG. 14A and increases by equal increments in each successive figure to a highest magnitude in FIG.

14F. The Vth distributions after one programming pass are relatively wide due to detrapping.

Each figure shows how the Vth distribution with the one-pulse reprogram changes with the program pulse magnitude. For the lowest program pulse magnitude of this example, in FIG. 14A, the Vth distribution 1401 is similar to the Vth distribution 1400, indicating that there is no benefit of the reprogramming. For the next highest program pulse magnitude, in FIG. 14B, the Vth distribution 1411 has a slight increase in the lower tail compared to the Vth distribution 1410 while the upper tail is the same. For the next highest program pulse magnitude, in FIG. 14C, the Vth distribution 1421 has a more significant increase of the lower tail compared to the Vth distribution 1420 while the upper tail is the same. For the next highest program pulse magnitude, in FIG. 14D, the Vth distribution 1431 has an even more significant increase of the lower tail compared to the Vth distribution 1430 while the upper tail is essentially the same. For the next highest program pulse magnitude, in FIG. 14E, the Vth distribution 1441 has an even more significant increase of the lower tail compared to the Vth distribution 1440 while the upper tail also has a significant increase. For the highest program pulse magnitude, in FIG. 14F, the Vth distribution 1451 has an even more significant increase of the lower tail compared to the Vth distribution 1450 while the upper tail also has a more significant increase.

The figures indicate that an optimum program pulse magnitude can be chosen for reprogramming each target data state. If the magnitude is too low, it may not be enough to push up the Vth of the slowest cells. If the magnitude is too high, the Vth of the fastest programming cells will increase too much and broaden the Vth distribution. There is a range of magnitudes in which the single pulse reprogramming is effective.

FIG. 14D provides an optimum program pulse magnitude because it results in a significant increase of the lower tail without increasing the upper tail. As a result, the Vth is narrowest among the examples provided.

FIG. 15A to 15F depict Vth distributions after one programming pass (Vth distributions 1500, 1510, 1520, 1530, 1540 and 1550 in FIGS. 15A, 15B, 15C, 15D, 15E and 15F, respectively) and after a one-pulse reprogram (Vth distributions 1501, 1511, 1521, 1531, 1541 and 1551 in FIGS. 15A, 15B, 15C, 15D, 15E and 15F, respectively), for different program pulse widths. The Vth distributions are for the B state, as an example. The program pulse magnitude for reprogramming is the same in each figure. The program pulse has a smallest width in FIG. 15A and increases by equal increments in each successive figure to a largest width in FIG. 15F. The Vth distributions after one programming pass are relatively wide due to detrapping.

Each figure shows how the Vth distribution with the one-pulse reprogram changes with the program pulse width. For the smallest program pulse width of this example, in FIG. 15A, the Vth distribution 1501 is similar to the Vth distribution 1500, indicating that there is no benefit of the reprogramming. For the next highest program pulse width, in FIG. 15B, the Vth distribution 1511 has a slight increase in the lower tail compared to the Vth distribution 1510 while the upper tail is the same. Also in FIG. 15B, the program pulse width is the same in the one programming pass and the reprogramming. For the next highest program pulse width, in FIG. 15C, the Vth distribution 1521 has a more significant increase of the lower tail compared to the Vth distribution 1520 while the upper tail is the same. For the next highest program pulse width, in FIG. 15D, the Vth distribution 1531 has an even more significant increase of the lower tail compared to the Vth distribution 1530 while the upper tail is essentially the same. For the next highest program pulse width, in FIG. 15E, the Vth distribution 1541 has an even more significant increase of the lower tail compared to the Vth distribution 1540 while the upper tail also has a significant increase. For the highest program pulse width, in FIG. 15F, the Vth distribution 1551 has an even more significant increase of the lower tail compared to the Vth distribution 1550 while the upper tail also has a more significant increase.

The figures indicate that an optimum program pulse width can be chosen for reprogramming each target data state. If the width is too low, it may not be enough to push up the Vth of the slowest cells. If the width is too high, the Vth of the fastest programming cells will increase too much and broaden the Vth distribution. There is a range of widths in which the single pulse reprogramming is effective.

Figure 15A:
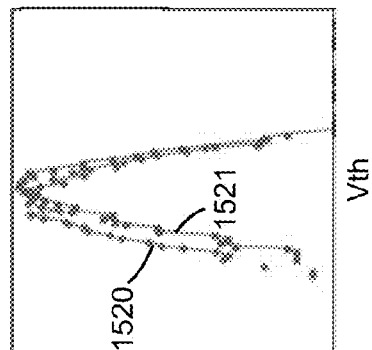
Figure 15C:
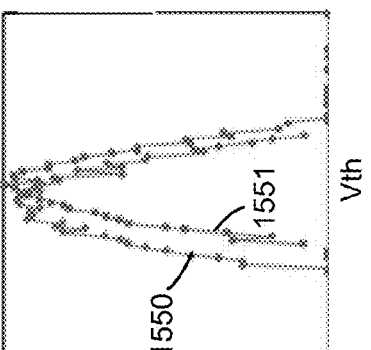
Figure 15E:
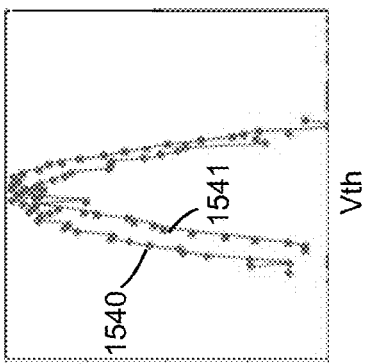
Figure 15D:
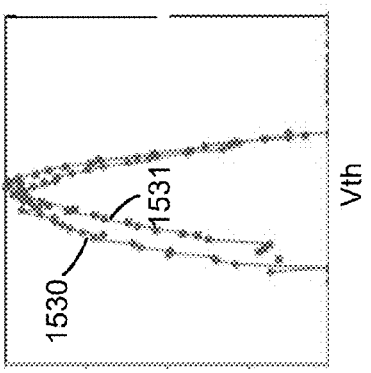

In this example, FIG. 15D provides an optimum program pulse width because it results in a significant increase of the lower tail without increasing the upper tail. As a result, the Vth is narrowest among the examples provided.

Using a longer program pulse width for the reprogramming can reduce the total number of program pulses in the reprogramming while still achieving a narrow Vth distribution and compensation for detrapping. When the program pulse is wide enough, the use of even one pulse alone for each data state can be sufficient to achieve a narrow Vth distribution.

Figure 16A:
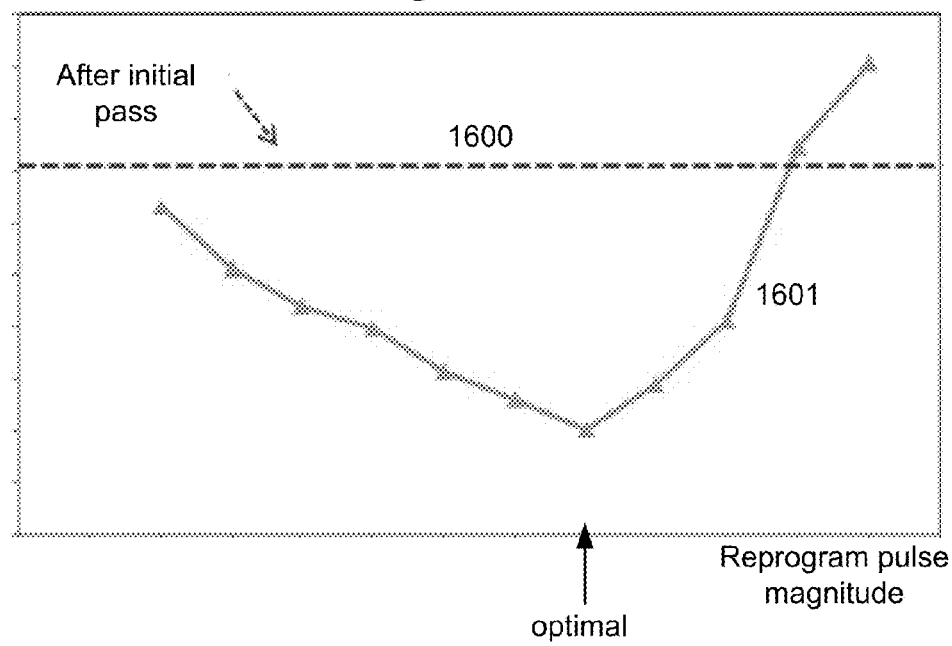
FIG. 16A depicts Vth width versus program pulse magnitude, showing a Vth width (line 1600) after one programming pass, and Vth widths which are achieved with different program pulse magnitudes after a one-pulse reprogram (line 1601), consistent with FIG. 14A to 14F.

FIG. 16A depicts Vth width versus program pulse magnitude, showing a Vth width (line 1600, a six sigma width) after one programming pass, and Vth widths which are achieved with different program pulse magnitudes after a one-pulse reprogram (line 1601), consistent with FIG. 14A to 14F. As the pulse magnitude increases above its lowest value, the Vth width decreases until it reaches an optimal value. With higher values of the pulse magnitude, the Vth width increases.

Figure 16B:
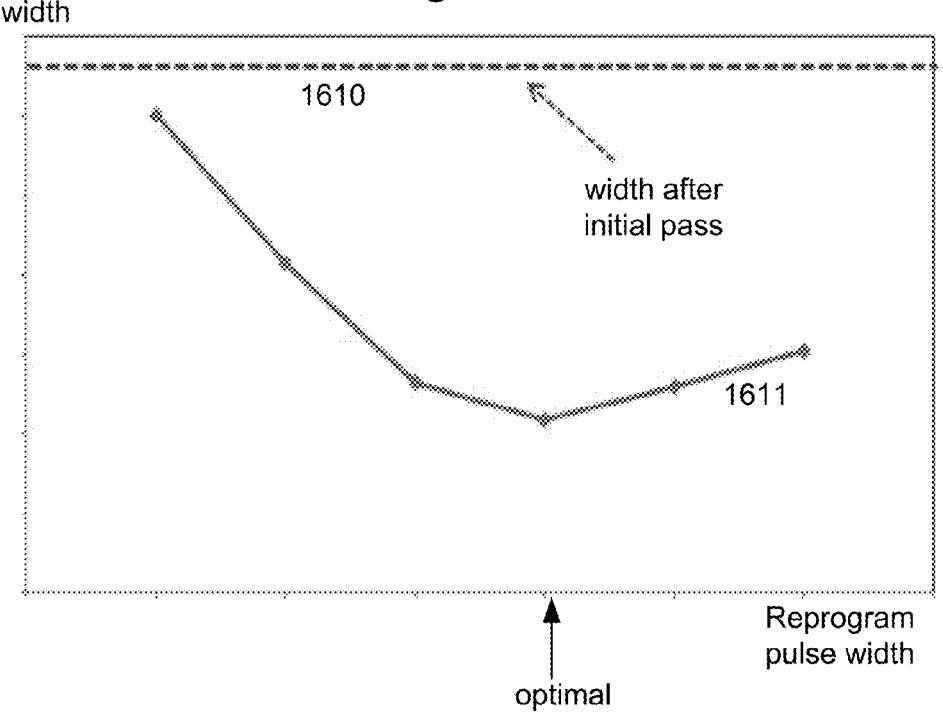
FIG. 16B depicts Vth width versus program pulse width, showing a Vth width (line 1610) after one programming pass, and Vth widths which are achieved with different program pulse widths (line 1611) after a one-pulse reprogram, consistent with FIG. 15A to 15F.

FIG. 16B depicts Vth width versus program pulse width, showing a Vth width (line 1610, a six sigma width) after one programming pass, and Vth widths which are achieved with different program pulse widths (line 1611) after a one-pulse reprogram, consistent with FIG. 15A to 15F. As the pulse width increases above its lowest value, the Vth width decreases until it reaches an optimal value. With higher values of the pulse width, the Vth width increases.

Figure 16C:
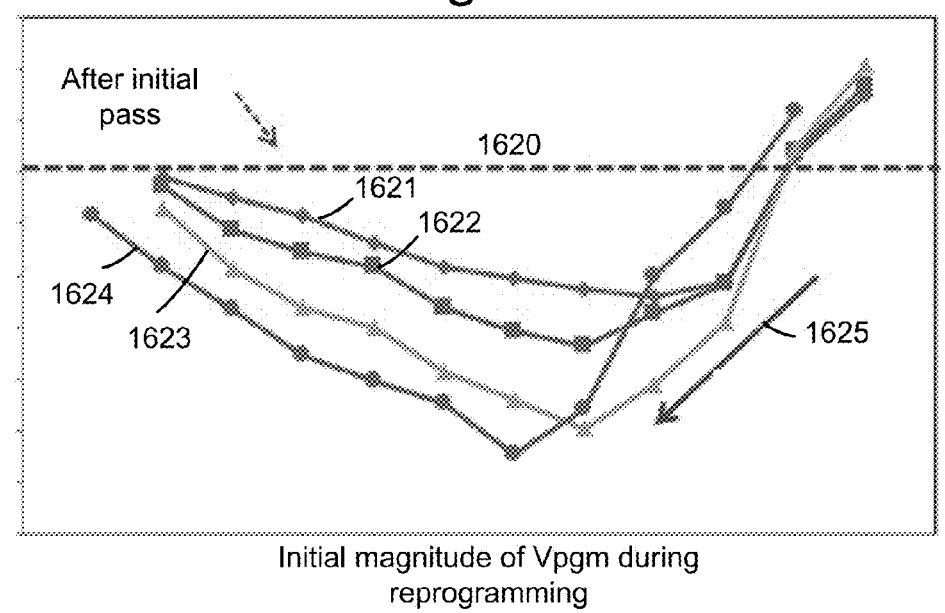
FIG. 16C depicts Vth width versus an initial program pulse magnitude for different values of program pulse width, showing a Vth width (line 1620) after one programming pass and Vth widths which are achieved with different program pulse widths (lines 1621-1624) after an incremental step pulse reprogramming pass.

FIG. 16C depicts Vth width versus an initial program pulse magnitude for different values of program pulse width, showing a Vth width (line 1620, a six sigma width) after one programming pass and Vth widths which are achieved with different program pulse widths (lines 1621-1624) after incremental step pulse reprogramming pass. Line 1621 depicts the smallest pulse width and line 1624 depicts the longest pulse width. An arrow 1625 depicts a reduction in the Vth width with increasing program pulse width.

An optimal initial magnitude of the program pulse can be chosen for the reprogramming pass based on the program pulse width. When the program pulse is relatively wide, the optimal initial magnitude of the program pulse is relatively low to avoid over programming.

Figure 16D:
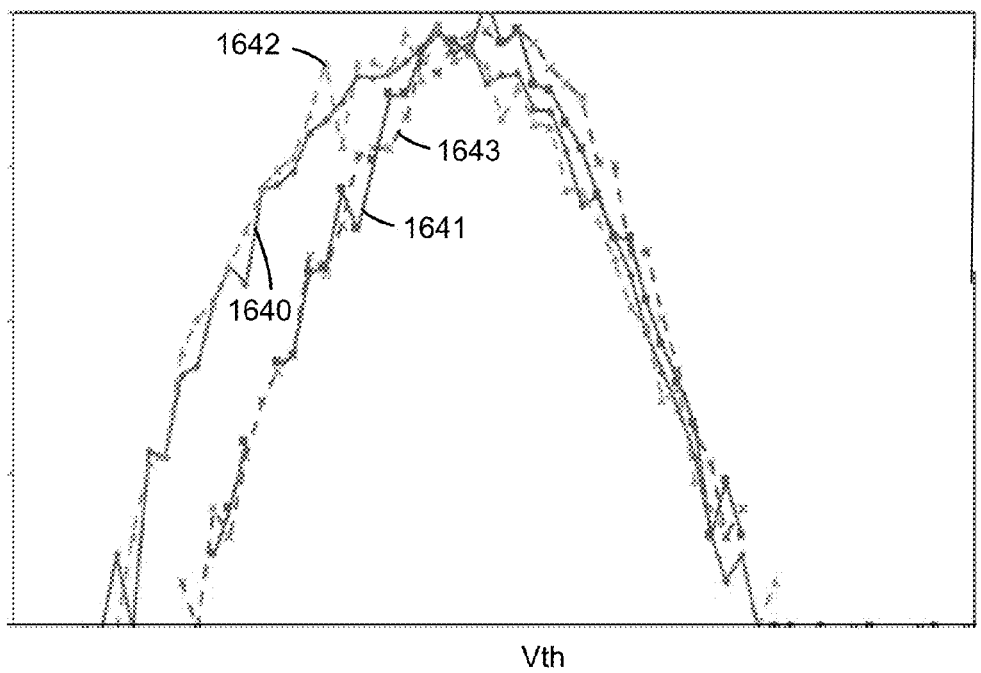
FIG. 16D depicts a number of cells on a logarithmic scale width versus Vth after an example programming pass (line 1640) and an associated full reprogramming using same width program pulses (line 1641), and after another example programming pass (line 1642) and an associated one-pulse per data state reprogramming using a longer width program pulse (line 1643).

FIG. 16D depicts a number of cells on a logarithmic scale width versus Vth after an example programming pass (line 1640) and an associated full reprogramming using same width program pulses (line 1641), and after another example programming pass (line 1642) and an associated one-pulse per data state reprogramming using a longer width program pulse (line 1643). The width of the Vth distribution is similar with the one-pulse per data state reprogramming with a longer program pulse or the full reprogramming with a shorter program pulse. As an example, the full reprogramming may use twenty or more program verify iterations.

Reprogramming using one pulse, or a reduced number of pulses, therefore results in a substantial time savings.

Figure 16E:
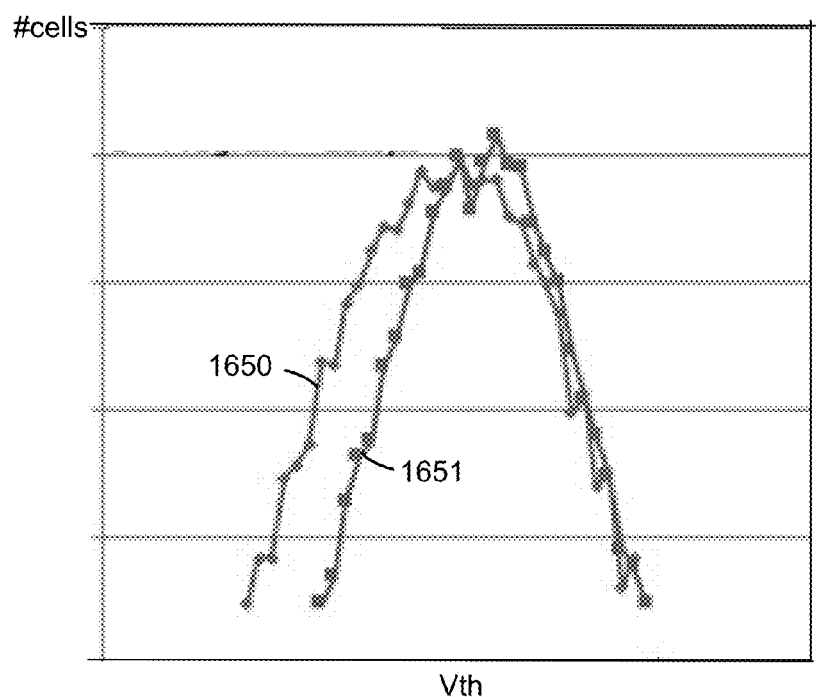
FIG. 16E depicts a number of cells on a logarithmic scale width versus Vth, after one programming pass (line 1650) and after an incremental step pulse reprogramming pass (line 1651), where a same pulse width is used in both cases.

FIG. 16E depicts a number of cells on a logarithmic scale width versus Vth, after one programming pass (line 1650) and after an incremental step pulse reprogramming pass (line 1651), where a same pulse width is used in both cases. In this example, eleven program loops were used in the reprogramming.

Figure 16F:
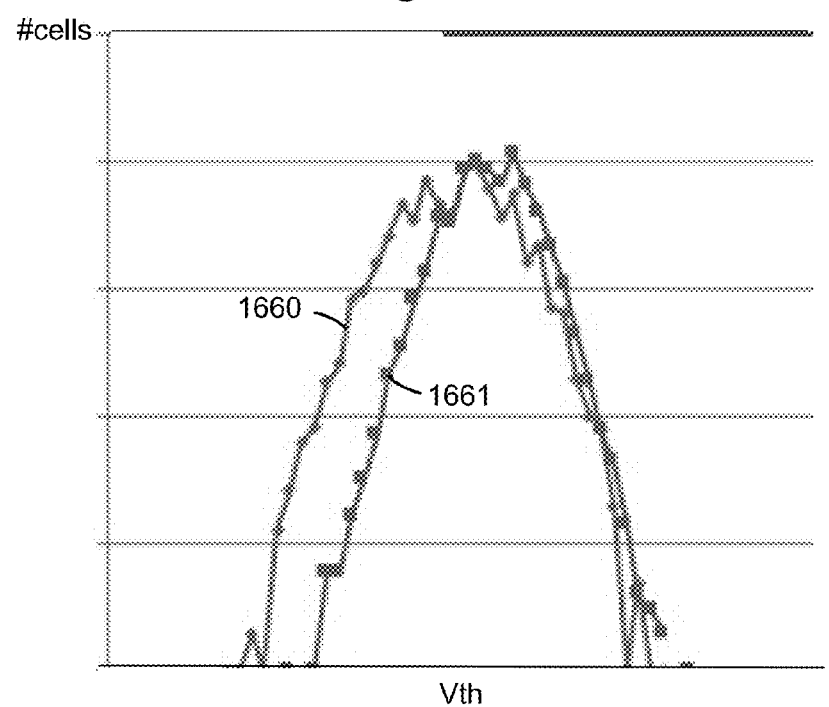
FIG. 16F depicts a number of cells on a logarithmic scale width versus Vth, after one programming pass (line 1660) and after an incremental step pulse reprogramming pass (line 1661), where a longer pulse width is used for the incremental step pulse reprogramming pass.

FIG. 16F depicts a number of cells on a logarithmic scale width versus Vth, after one programming pass (line 1660) and after an incremental step pulse reprogramming pass (line 1661), where a longer pulse width is used for the incremental step pulse reprogramming pass. In this example, six program loops were used in the reprogramming and the pulse width was longer than in the one programming pass by a factor of about 2×. The reduction in the Vth distribution width is comparable to that in FIG. 16E while the total reprogramming time is reduced by about one third. Although the reprogramming uses a longer pulse width in FIG. 16E, there are fewer program pulses applied. Additionally, there is less time spent in ramping voltages up and down. The combined ramp up and ramp down time of a program pulse can be longer than the program pulse width.

Figure 17A:
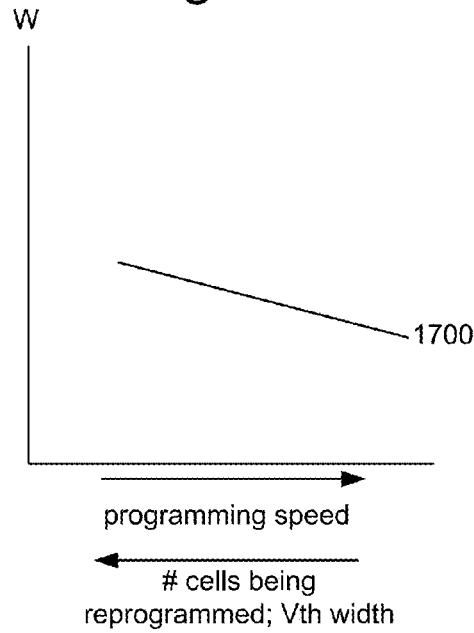
FIG. 17A depicts a plot of program pulse width (W) (line 1700) versus a programming speed or a number of cells being reprogrammed, for incremental step pulse reprogramming with common or separate reprogramming of all data states.

FIG. 17A depicts a plot of program pulse width (W) (line 1700) versus a programming speed, a number of cells being reprogrammed or a Vth width, for incremental step pulse reprogramming with common or separate reprogramming of all data states. As mentioned in connection with FIG. 11C, for instance, the programming speed of the memory cells can be determined from the prior full programming pass and this information used to set the programming parameters such as pulse width in the reprogramming.

Generally, a relatively slower programming speed, e.g., a speed below a baseline level, indicates a relatively stronger reprogramming is warranted. The relatively stronger reprogramming can be implemented using a relatively longer W.

The programming speed can be an average programming speed across all of the target data states, in one approach. Similarly, the number of cells being reprogrammed can be an average across all of the target data states, in one approach, or a sum of all cells being reprogrammed regardless of the target data state.

Also, as mentioned in connection with FIG. 12C, for instance, the reprogramming speed of deficient cells of one target data state can be used to adjust the reprogramming of deficient cells of one or more other target data states. Generally, a relatively slower programming speed for the deficient cells of one target data state indicates a relatively stronger reprogramming (e.g., longer pulse width) is warranted for the reprogramming of deficient cells of one or more other target data states.

The number of cells being reprogrammed will be relatively larger when there is a relatively higher amount of detrapping among the memory cells. Generally, a relatively larger number of memory cells being reprogrammed, e.g., a number above a baseline level, indicates a relatively stronger reprogramming is warranted. When a relatively larger number of memory cells is reprogrammed, the lower tail of the Vth distribution of each data state is expected to be lower. A relatively stronger reprogramming is indicated to push up the bottom portion of the lower tail, e.g., the cells with the most detrapping and largest Vth downshift.

The Vth width will also be relatively larger when there is a relatively higher amount of detrapping among the memory cells, so that a relatively wider W is indicated.

Figure 17B:
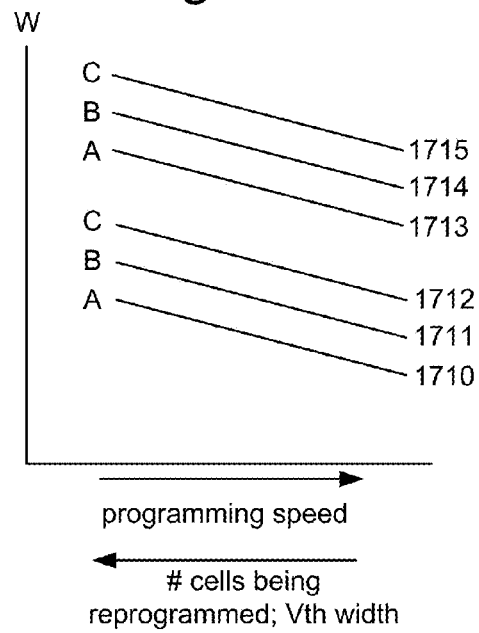
FIG. 17B depicts a plot of program pulse width (W) versus a programming speed or a number of cells being reprogrammed for incremental step pulse reprogramming or one-pulse per data state reprogramming with separate reprogramming of each data state.

FIG. 17B depicts a plot of program pulse width (W) versus a programming speed or a number of cells being reprogrammed for incremental step pulse reprogramming or one-pulse per data state reprogramming with separate reprogramming of each data state. W can be optimized for the reprogramming of each target data state. As with FIG. 17A, a relatively slower programming speed and a relatively larger number of memory cells being reprogrammed indicates a relatively longer W is warranted. For example, see pulse widths W_A1, W_B1 and W_C1. Moreover, for a given programming speed, a relatively longer W is warranted for a higher target data state than a lower target data state. Moreover, for a given programming speed and a given target data state, a relatively longer W is warranted for one-pulse per data state reprogramming than incremental step pulse reprogramming. Lines 1710, 1711 and 1712 are associated with incremental step pulse reprogramming of the A, B and C states, respectively. Lines 1713, 1714 and 1715 are associated with single-pulse reprogramming of the A, B and C states, respectively.

As before, a relatively higher number of cells being reprogrammed or a relatively larger Vth width indicates that a relatively wider W should be used.

Figure 17C:
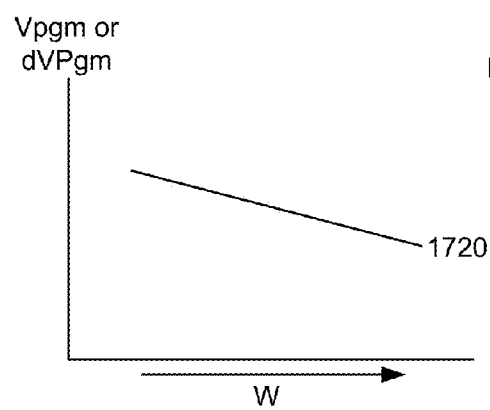
FIG. 17C depicts a plot of program pulse magnitude (Vpgmt) or step size (dVpgm) versus program pulse width (W) in a reprogramming.

FIG. 17C depicts a plot of program pulse magnitude (Vpgm) or step size (dVpgm) versus program pulse width (W) in a reprogramming (line 1720). When a relatively larger W is used in reprogramming, the program pulse magnitude (Vpgm) and/or step size (dVpgm) can be reduced compared to the full programming pass to avoid over programming. This can apply to both one pulse and incremental step pulse reprogramming, with separate or common reprogramming of different target data states. For one-pulse per data state reprogramming, there is one program pulse magnitude per target data state. For incremental step pulse reprogramming, the program pulse magnitude may be the initial magnitude (Vpgm_init) for each target data state when the target data states are reprogrammed separately, or for all target data states when the target data states are reprogrammed concurrently.

Figure 17D:
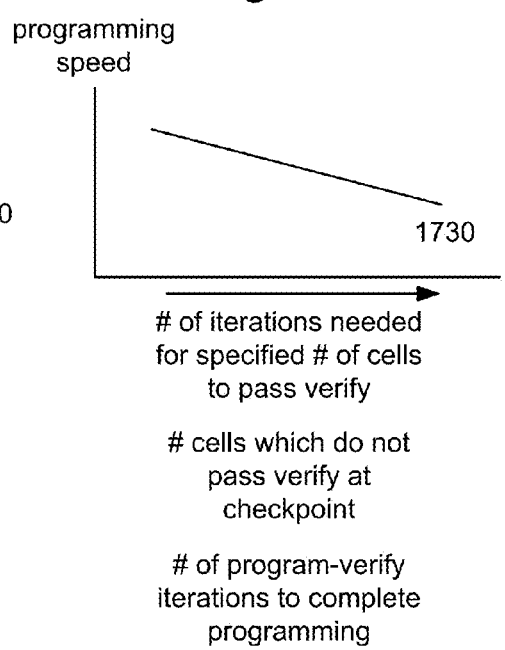
FIG. 17D depicts a plot of programming speed versus various programming metrics, consistent with step 545b of FIG. 5C or step 564b of FIG. 5E.

FIG. 17D depicts a plot of programming speed versus various programming metrics, consistent with step 545b of FIG. 5C or step 564b of FIG. 5E (line 1730). The programming metrics include a number of iterations needed for a specified number of cells to pass a verify test, a number of cells which do not pass a verify test at a checkpoint, or a number of program-verify iterations to complete programming. A relatively higher value of the metrics indicates a relatively higher programming speed. Each metric can be determined for each target data state. Using these metrics, a control with associated logic can determine programming speed and determine an optimal program pulse width, magnitude and/or step size. For example, the control may use tables of values which are cross-referenced to the metrics. Or, the control may evaluate equations which are a function of the metrics and/or the programming speed.

Regarding a number of iterations needed for a specified number of cells to pass a verify test, this can be, e.g., a number of program-verify iterations needed to complete programming of the cells of a target data state, where the specified number represents all or nearly all (e.g., 95%) of the cells of that target data state. For instance, in FIG. 11A, the programming of the A state cells is completed in PV8 (eight iterations). As another example, the specified number could represent a smaller percentage of the A state cells. For example, 80% of the A state cells may pass the verify text at PV6. A count of the number of cells which pass the verify test for a target data state can be made in each program-verify iteration by a control circuit. The iteration in which the count exceeds a specified level can be stored and used to determine a programming speed to set the programming parameters for the reprogramming of that target data state.

Regarding a number of cells which do not pass a verify test at a checkpoint, this number can be determined at the A state checkpoint in PV3 in FIG. 11A, for instance, for the A state cells. The number can be stored and used to determine a programming speed to set the programming parameters for the reprogramming of that target data state.

Regarding a number of program-verify iterations to complete programming, the programming of the A state cells is completed in PV8 (eight iterations), for example, in FIG. 11A.

The metrics can be determined in the full programming pass and/or in the reprogramming. For example, in the reprogramming, as discussed in connection with FIG. 12D, the region 1285 represents a portion or count of the deficient A state cells that have not passed the verify level in the third program-verify iteration.

FIG. 18A depicts a bit combination in a set of latches for an erased memory cell. As mentioned in connection with FIG. 1C, a set of latches can be associated with each bit line and each memory cell in a set of memory cells connected to a word line. Each set of latches indicates whether a cell is to remain in the erased state or is to be programmed to a target data state. Each set of latches can also indicates whether a cell is to be reprogrammed. Here, the bit combination is 11x (LDL/UDL/VDL), where x can be 0 or 1. LDL/UDL=11 denotes the erased state.

FIG. 18B depicts a set of latches for an A-state memory cell, where one bit combination (010) indicates the cell is to be programmed or reprogrammed, and another bit combination (011) indicates the cell has passed a verify test, during one programming pass and/or during a reprogramming. The bit combination is 010 initially where LDL/UDL=01 denotes the A state. For an A state cell which passes the verify test in the full programming pass, the bit combination is changed to 011. VDL=1 informs the programming circuitry that the cell is in a locked out state for a remainder of the programming pass. If this cell passes the verify test in the detrapping evaluation process (e.g., using the set of verify voltages 1125 in FIG. 11A), the bit combination remains at 011 and during the reprogramming, VDL=1 indicates that the cell is not to be reprogrammed. If this cell fails the verify test in the detrapping evaluation process, the bit combination changes back to 010 and during the reprogramming, VDL=0 indicates that the cell is to be reprogrammed.

For an A state cell which does not pass the verify test in the full programming pass, the bit combination remains at 010. If this cell passes the verify test in the detrapping evaluation process, the bit combination changes to 011 and during the reprogramming, VDL=1 indicates that the cell is not to be reprogrammed. If this cell also fails the verify test in the detrapping evaluation process, the bit combination remains at 010 and during the reprogramming, VDL=0 indicates that the cell is to be reprogrammed.

FIG. 18C depicts a set of latches for a B-state memory cell, where one bit combination (000) indicates the cell is to be programmed or reprogrammed, and another bit combination (001) indicates the cell has passed a verify test, during one programming pass and/or during a reprogramming. The bit combination is 000 initially where LDL/UDL=00 denotes the B state. For a B state cell which passes the verify test in the full programming pass, the bit combination is changed to 001. VDL=1 informs the programming circuitry that the cell is in a locked out state for a remainder of the programming pass. If this cell passes the verify test in the detrapping evaluation process, the bit combination remains at 001 and during the reprogramming, VDL=1 indicates that the cell is not to be reprogrammed. If this cell fails the verify test in the detrapping evaluation process, the bit combination changes back to 000 and during the reprogramming, VDL=0 indicates that the cell is to be reprogrammed.

For a B state cell which does not pass the verify test in the full programming pass, the bit combination remains at 000. If this cell passes the verify test in the detrapping evaluation process, the bit combination changes to 001 and during the reprogramming, VDL=1 indicates that the cell is not to be reprogrammed. If this cell also fails the verify test in the detrapping evaluation process, the bit combination remains at 000 and during the reprogramming, VDL=0 indicates that the cell is to be reprogrammed.

FIG. 18D depicts a set of latches for a C-state memory cell, where one bit combination (100) indicates the cell is to be programmed or reprogrammed, and another bit combination (101) indicates the cell has passed a verify test, during one programming pass and/or during a reprogramming. The bit combination is 100 initially where LDL/UDL=10 denotes the C state. For a C state cell which passes the verify test in the full programming pass, the bit combination is changed to 101. VDL=1 informs the programming circuitry that the cell is in a locked out state for a remainder of the programming pass. If this cell passes the verify test in the detrapping evaluation process, the bit combination remains at 101 and during the reprogramming, VDL=1 indicates that the cell is not to be reprogrammed. If this cell fails the verify test in the detrapping evaluation process, the bit combination changes back to 100 and during the reprogramming, VDL=0 indicates that the cell is to be reprogrammed.

For a C state cell which does not pass the verify test in the full programming pass, the bit combination remains at 100. If this cell passes the verify test in the detrapping evaluation process, the bit combination changes to 101 and during the reprogramming, VDL=1 indicates that the cell is not to be reprogrammed. If this cell also fails the verify test in the detrapping evaluation process, the bit combination remains at 100 and during the reprogramming, VDL=0 indicates that the cell is to be reprogrammed.

Figure 19:
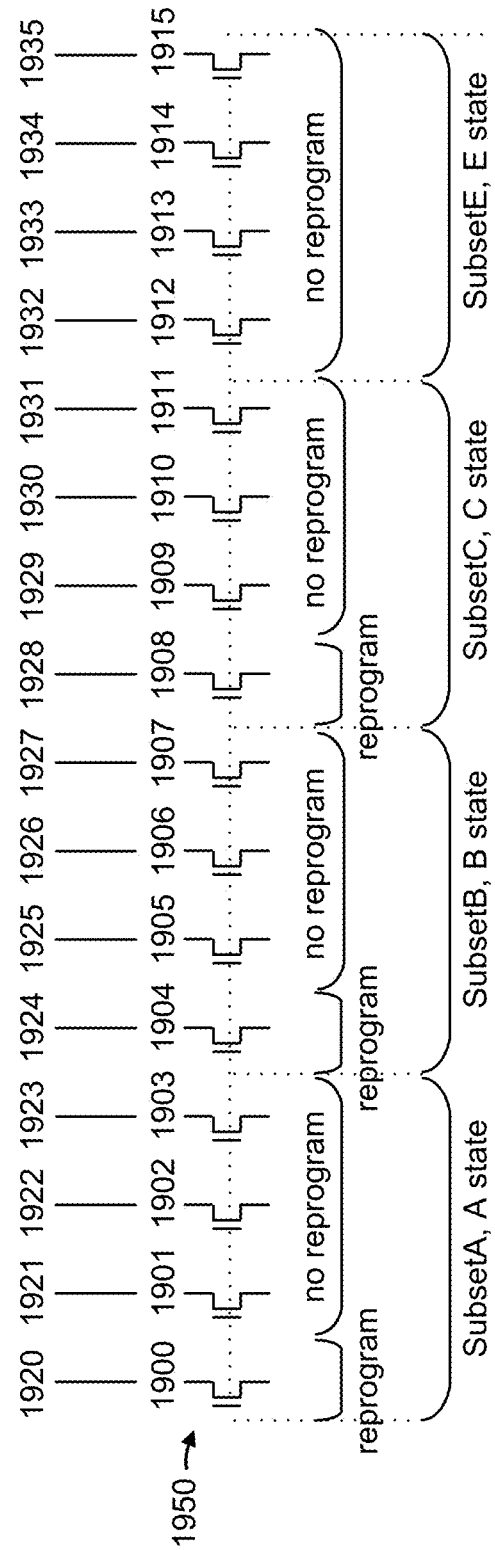
FIG. 19 depicts an example set of memory cells.

FIG. 19 depicts an example set of memory cells 1950, including memory cells 1900-1915 and associated bit lines 1920-1935, respectively. In a simplified example, subsetA includes memory cells with the A state as the target data state, subsetB includes memory cells with the B state as the target data state, subsetC includes memory cells with the C state as the target data state, and subsetE includes memory cells in the E state. In subsetA, memory cell 1900 is subject to reprogramming and memory cells 1901-1903 are not subject to reprogramming. In subsetB, memory cell 1904 is subject to reprogramming and memory cells 1905-1907 are not subject to reprogramming. In subsetC, memory cell 1908 is subject to reprogramming and memory cells 1909-1911 are not subject to reprogramming. In subsetE, memory cells 1912-1915 are not subject to reprogramming. Generally, a fraction of the memory cells will be subject to reprogramming such as 1-20% of all memory cells.

Accordingly, it can be seen that, in one embodiment, a method for programming in a memory device comprises: performing a plurality of program-verify iterations in one programming pass for a set of memory cells until completion of the one programming pass, the set of memory cells comprises respective subsets of memory cells, each respective subset of memory cells has a respective target data state defined by a respective verify voltage; after the completion of the one programming pass, identifying memory cells of each respective target data state for which reprogramming is warranted by performing a verify test to identify memory cells of each respective target data state having a threshold voltage which is below a respective verify voltage; and performing a plurality of program-verify iterations in a reprogramming pass for the memory cells of each respective target data state for which reprogramming is warranted, wherein for each respective target data state, a width of a program pulse applied to the set of memory cells during the program-verify iterations in the reprogramming pass is longer than a width of a program pulse applied to the set of memory cells during the program-verify iterations in the one programming pass.

In another embodiment, a memory device comprises: a set of memory cells comprising respective subsets of memory cells, each respective subset of memory cells has a respective target data state defined by a respective verify voltage; and a control circuit. The control circuit: performs a plurality of program-verify iterations in one programming pass for the set of memory cells until completion of the one programming pass, after the completion of the one programming pass, identifies memory cells of each respective target data state for which reprogramming is warranted by performing a verify test to identify memory cells of each respective target data state having a threshold voltage which is below a respective verify voltage, and performs a plurality of program-verify iterations in a reprogramming pass for the memory cells of each respective target data state for which reprogramming is warranted, wherein a width of a program pulse applied to the set of memory cells during the program-verify iterations in the reprogramming pass is longer than a width of a program pulse applied to the set of memory cells during the program-verify iterations in the one programming pass.

In another embodiment, a method for programming in a memory device comprises: performing a plurality of program-verify iterations in one programming pass for a set of memory cells until completion of the one programming pass, the set of memory cells comprises a subset of memory cells having a target data state defined by a verify voltage; after the completion of the one programming pass, identifying memory cells of the target data state for which reprogramming is warranted by performing a verify test to identify memory cells of the target data state having a threshold voltage which is below a respective verify voltage; and performing a plurality of program-verify iterations in a reprogramming pass for the memory cells of the target data state for which reprogramming is warranted, wherein a width of program pulses applied to the set of memory cells during the program-verify iterations in the reprogramming pass is longer than a width of program pulses applied to the set of memory cells during the program-verify iterations in the one programming pass.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming in a memory device, comprising:

performing a plurality of program-verify iterations in one programming pass for a set of memory cells until a completion criterion is met for the one programming pass, wherein the set of memory cells comprises respective subsets of memory cells, each respective subset of memory cells has a respective target data state defined by a respective verify voltage and the completion criterion is met when at least a specified percentage of memory cells of each set of memory cells has a threshold voltage which is above the respective verify voltage;

after the completion criterion is met for the one programming pass, identifying memory cells of each respective target data state for which reprogramming is warranted by performing a verify test to identify memory cells of each respective target data state having a threshold voltage which exceeded and then fell below a respective verify voltage; and performing a plurality of program-verify iterations in a reprogramming pass for the memory cells of each respective target data state for which reprogramming is warranted, wherein for each respective target data state, a width of a program pulse applied to the set of memory cells during the program-verify iterations in the reprogramming pass is longer than a width of a program pulse applied to the set of memory cells during the program-verify iterations in the one programming pass.

2. The method of claim 1, wherein:

for each respective subset of memory cells, a respective verify voltage of the respective target data state in the reprogramming pass is higher than the respective verify voltage of the respective target data state in the one programming pass.

3. The method of claim 1, wherein:

the plurality of program-verify iterations in the reprogramming pass comprise a separate set of program-verify iterations for each respective target data state;

the widths of the program pulse applied to the set of memory cells during the program-verify iterations in the reprogramming pass comprise a different width for each of the separate sets of program verify iterations; and the different widths are greater for relatively higher target data states among the respective target data states than for relatively lower target data states among the respective target data states.

4. The method of claim 3, wherein:

for each separate set of program-verify iterations and for each respective target data state, the width of the program pulse applied to the set of memory cells is based on number of memory cells for which reprogramming is warranted.

5. The method of claim 3, wherein:

for each separate set of program-verify iterations and for each respective target data state, the width of the program pulse applied to the set of memory cells is based on a programming speed in the one programming pass.

6. The method of claim 3, wherein:

for at least one of the separate sets of program-verify iterations, the width of the program pulse applied to the set of memory cells is based on a programming speed in another of the separate sets of program-verify iterations.

7. The method of claim 3, wherein:

each of the separate sets of program-verify iterations comprises no more than a maximum allowable number of program-verify iterations; and at least one of the memory cells for which reprogramming is warranted and which does not pass a verify test in one of the sets of program-verify iterations is allowed to be programmed by one additional program pulse, without verify, of a program-verify iteration of another of the sets of program-verify iterations.

8. The method of claim 3, wherein:
each of the separate sets of program verify iterations uses a different staircase progression of program pulses; and
the different staircase progressions of program pulses have different step sizes.

9. The method of claim 3, wherein:
each of the separate sets of program verify iterations uses a different staircase progression of program pulses; and
at least one of the different staircase progressions of program pulses has an initial magnitude which is not consistent with a staircase progression of program voltages of a prior one of the different staircase progressions of program voltages.

10. The method of claim 1, wherein:
the plurality of program-verify iterations in the reprogramming pass are common to each respective target data state.

11. The method of claim 10, wherein:
the width of the program pulse applied to the set of memory cells is based on a programming speed of the set of memory cells in the one programming pass.

12. The method of claim 10, wherein:
the width of the program pulse applied to the set of memory cells is based on a number of memory cells for which reprogramming is warranted.

13. The method of claim 1, wherein:
after the completion criterion is met for the one programming pass, obtaining a measure of a width of a threshold voltage distribution of at least one of the target data states, wherein for the at least one of the target data states, the width of the program pulse applied to the set of memory cells during the program-verify iterations in the reprogramming pass is based on the measure of the width of the threshold voltage distribution.

14. A memory device, comprising:
a set of memory cells comprising respective subsets of memory cells, each respective subset of memory cells has a respective target data state defined by a respective verify voltage; and
a control circuit, the control circuit configured to:
perform a plurality of program-verify iterations in one programming pass for the set of memory cells until a completion criterion is met for the one programming pass, wherein the completion criterion is met when at least a specified percentage of memory cells of each set of memory cells has a threshold voltage which is above the respective verify voltage,
after the completion criterion is met for the one programming pass, identify memory cells of each respective target data state for which reprogramming is warranted by performing a verify test to identify memory cells of each respective target data state having a threshold voltage which exceeded and then fell below a respective verify voltage, and
perform a plurality of program-verify iterations in a reprogramming pass for the memory cells of each respective target data state for which reprogramming is warranted, wherein a width of a program pulse applied to the set of memory cells during the program-verify iterations in the reprogramming pass is longer than a width of a program pulse applied to the set of memory cells during the program-verify iterations in the one programming pass.

15. The memory device of claim 14, wherein:
the plurality of program-verify iterations in the reprogramming pass comprises a separate set of program-verify iterations for each respective target data state;
the width of the program pulse applied to the set of memory cells during the program-verify iterations in the reprogramming pass comprise a different width for each of the separate sets of program verify iterations; and
the different widths are greater for relatively higher target data states among the respective target data states than for relatively lower target data states among the respective target data states.

16. The memory device of claim 14, wherein:
the plurality of program-verify iterations in the reprogramming pass are common to each respective target data state.

17. The memory device of claim 14, wherein:
the set of memory cells comprise charge-trapping memory cells in a three-dimensional stacked memory structure comprising alternating conductive layers and dielectric layers; and
the set of memory cells is connected to one of the conductive layers.

18. The memory device of claim 14, wherein:
the set of memory cells comprise charge-trapping memory cells.

19. A method for programming in a memory device, comprising:
performing a plurality of program-verify iterations in one programming pass for a set of memory cells until a completion criterion is met for the one programming pass, wherein the set of memory cells comprises a subset of memory cells having a target data state defined by a verify voltage, and the completion criterion is met when at least a specified percentage of memory cells of the set of memory cells has a threshold voltage which is above the verify voltage;
after the completion criterion is met for the one programming pass, identifying memory cells of the target data state for which reprogramming is warranted by performing a verify test to identify memory cells of the target data state having a threshold voltage which exceeded and then fell below a respective verify voltage; and
performing a plurality of program-verify iterations in a reprogramming pass for the memory cells of the target data state for which reprogramming is warranted, wherein a width of program pulses applied to the set of memory cells during the program-verify iterations in the reprogramming pass is longer than a width of program pulses applied to the set of memory cells during the program-verify iterations in the one programming pass.

20. The method of claim 19, wherein:
an initial magnitude of the program pulses applied to the set of memory cells during the program-verify iterations in the reprogramming pass is less than an initial magnitude of the program pulses applied to the set of memory cells during the program-verify iterations in the one programming pass.

21. The method of claim 19, wherein:
a maximum allowable number of the plurality of program-verify iterations in the reprogramming pass is less than a maximum allowable number of the plurality of program-verify iterations in the one programming pass.

* * * * *